(12) United States Patent
Seong et al.

(10) Patent No.: US 10,840,139 B2
(45) Date of Patent: Nov. 17, 2020

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Geum Jung Seong, Seoul (KR); Seung Soo Hong, Incheon (KR); Young Mook Oh, Hwaseoung-si (KR); Jeong Yun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/212,987

(22) Filed: Dec. 7, 2018

(65) Prior Publication Data

US 2019/0333812 A1 Oct. 31, 2019

(30) Foreign Application Priority Data

Apr. 26, 2018 (KR) ........................ 10-2018-0048287

(51) Int. Cl.
| | |
|---|---|
| *H01L 23/535* | (2006.01) |
| *H01L 21/768* | (2006.01) |
| *H01L 29/78* | (2006.01) |
| *H01L 29/49* | (2006.01) |
| *H01L 21/28* | (2006.01) |
| *H01L 29/66* | (2006.01) |

(52) U.S. Cl.
CPC .. *H01L 21/76897* (2013.01); *H01L 21/28123* (2013.01); *H01L 21/76805* (2013.01); *H01L 21/76829* (2013.01); *H01L 21/76895* (2013.01); *H01L 23/535* (2013.01); *H01L 29/4983* (2013.01); *H01L 29/66795* (2013.01); *H01L 29/7851* (2013.01)

(58) Field of Classification Search
CPC ......... H01L 21/76897; H01L 21/28123; H01L 21/76805; H01L 21/76829; H01L 21/76895; H01L 23/535; H01L 29/4983; H01L 29/66795; H01L 29/7851; H01L 29/6653; H01L 29/6656
See application file for complete search history.

(56) References Cited

U.S. PATENT DOCUMENTS

| | | | |
|---|---|---|---|
| 8,084,311 | B1 | 12/2011 | Horak et al. |
| 8,426,300 | B2 | 4/2013 | Ramachandran et al. |
| 9,070,711 | B2 | 6/2015 | Xie et al. |
| 9,105,606 | B2 | 8/2015 | Cheng et al. |
| 9,236,383 | B2 | 1/2016 | Manning |

(Continued)

FOREIGN PATENT DOCUMENTS

KR    10-2016-0009755 A    1/2016

*Primary Examiner* — Fernando L Toledo
*Assistant Examiner* — Valerie N Newton
(74) *Attorney, Agent, or Firm* — Lee IP Law, P.C.

(57) ABSTRACT

A semiconductor device includes a fin type pattern extending in a first direction on a substrate, a field insulating layer on the substrate, the field insulating layer wrapping a side wall of the fin type pattern, a gate electrode on the fin type pattern, the gate electrode extending in a second direction intersecting with the first direction, a first spacer on a side wall of a lower part of the gate electrode, and an etching stop layer extending along a side wall and an upper surface of an upper part of the gate electrode, along a side wall of the first spacer, and along an upper surface of the field insulating layer.

20 Claims, 29 Drawing Sheets

(56) References Cited

U.S. PATENT DOCUMENTS

| | | |
|---|---|---|
| 9,263,537 B2 | 2/2016 | Pham et al. |
| 9,356,018 B2 | 5/2016 | Song |
| 9,379,210 B2 | 6/2016 | Mountsier et al. |
| 9,397,003 B1 | 7/2016 | Niimi et al. |
| 9,460,963 B2 | 10/2016 | Wells et al. |
| 9,812,536 B2 | 11/2017 | Fu et al. |
| 2008/0237726 A1* | 10/2008 | Dyer ................. H01L 21/82380 257/369 |
| 2014/0087535 A1* | 3/2014 | Roh ................ H01L 21/823412 438/285 |
| 2015/0228776 A1 | 8/2015 | Xie |
| 2015/0357440 A1* | 12/2015 | Cheng ............... H01L 29/66795 257/401 |
| 2016/0233310 A1* | 8/2016 | Lee .................... H01L 29/6656 |
| 2017/0186849 A1 | 6/2017 | Chen et al. |
| 2017/0317076 A1 | 11/2017 | Shen et al. |

\* cited by examiner

SEMICONDUCTOR DEVICE AND METHOD FOR FABRICATING THE SAME

CROSS-REFERENCE TO RELATED APPLICATION

Korean Patent Application No. 10-2018-0048287, filed on Apr. 26, 2018, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same. More specifically, the present disclosure relates to a semiconductor device including a self-aligned contact (SAC) and a method for fabricating the same.

2. Description of the Related Art

As one of scaling techniques for increasing the density of the semiconductor device, a multi-gate transistor, in which a fin-shaped silicon body is formed on the substrate and a gate is formed on the surface of the silicon body, is proposed. Since such a multi-gate transistor utilizes three-dimensional channels, scaling is easily performed. Furthermore, the current control capability may be improved, even without increasing the gate length of the multi-gate transistor. Furthermore, it is possible to effectively suppress a short channel effect (SCE) in which the potential of the channel region is affected by the drain voltage.

SUMMARY

According to aspects of embodiments, there is provided a semiconductor device including a fin type pattern extending in a first direction on a substrate, a field insulating layer which wraps a side wall of the fin type pattern, on the substrate, a gate electrode extending in a second direction intersecting with the first direction, on the fin type pattern, a first spacer on a side wall of a lower part of the gate electrode, and an etching stop layer extending along a side wall and an upper surface of an upper part of the gate electrode, a side wall of the first spacer and an upper surface of the field insulating layer.

According to aspects of embodiments, there is provided a semiconductor device including a substrate, a gate electrode including a lower part and an upper part on the substrate, a spacer on a side wall of a lower part of the gate electrode, an etching stop layer extending along a side wall and an upper surface of an upper part of the gate electrode, on the spacer, and a capping pattern having a dielectric constant lower than that of the etching stop, layer, on the etching stop layer.

According to aspects of embodiments, there is provided a semiconductor device including a substrate, a gate electrode on the substrate, a spacer on a side wall of the gate electrode, and an etching stop layer including aluminum oxide on the gate electrode and the spacer, wherein a height of an upper surface of the spacer is lower than a height of an upper surface of the gate electrode.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, s semiconductor device according to some embodiments will be described with reference to FIGS. 1 to 3.

Figure 1:
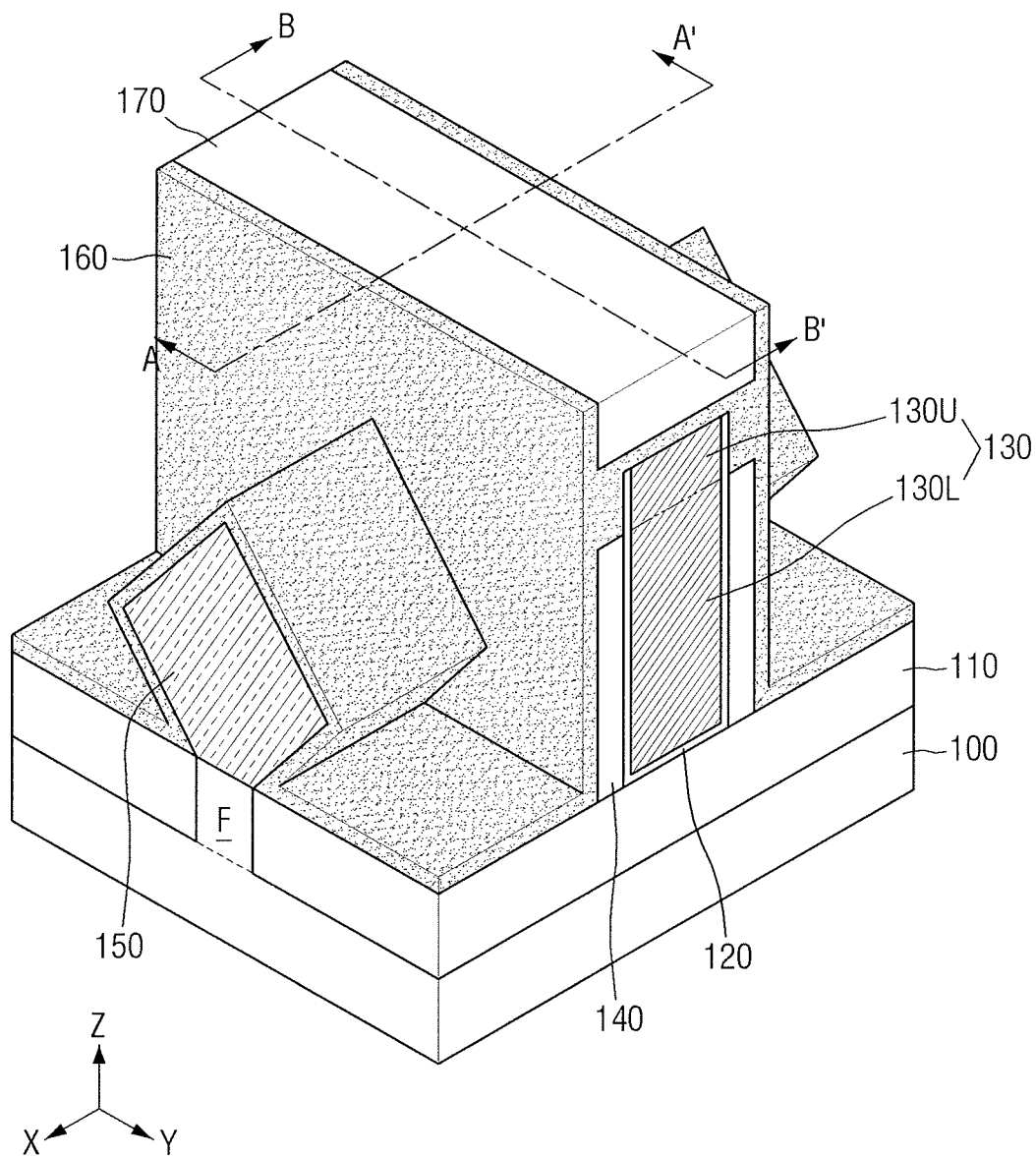
FIG. 1 illustrates a perspective view of a semiconductor device according to some embodiments.

FIG. 1 is a perspective view of a semiconductor device according to some embodiments. FIG. 2 is a cross-sectional view taken along line A-A' of FIG. 1, and FIG. 3 is a cross-sectional view taken along line B-B' of FIG. 1. For convenience of description, a first interlayer insulating layer 180 and a second interlayer insulating layer 280 are not illustrated in FIG. 1.

In the drawings of the semiconductor device according to some embodiments, a fin type transistor (finFET) including a fin-shaped channel region is exemplarily illustrated, but the present disclosure is not limited thereto. In addition, the semiconductor device according to some embodiments may include a tunneling transistor (FET), a bipolar junction transistor, a lateral double diffused transistor (LDMOS), or the like.

Figure 2:
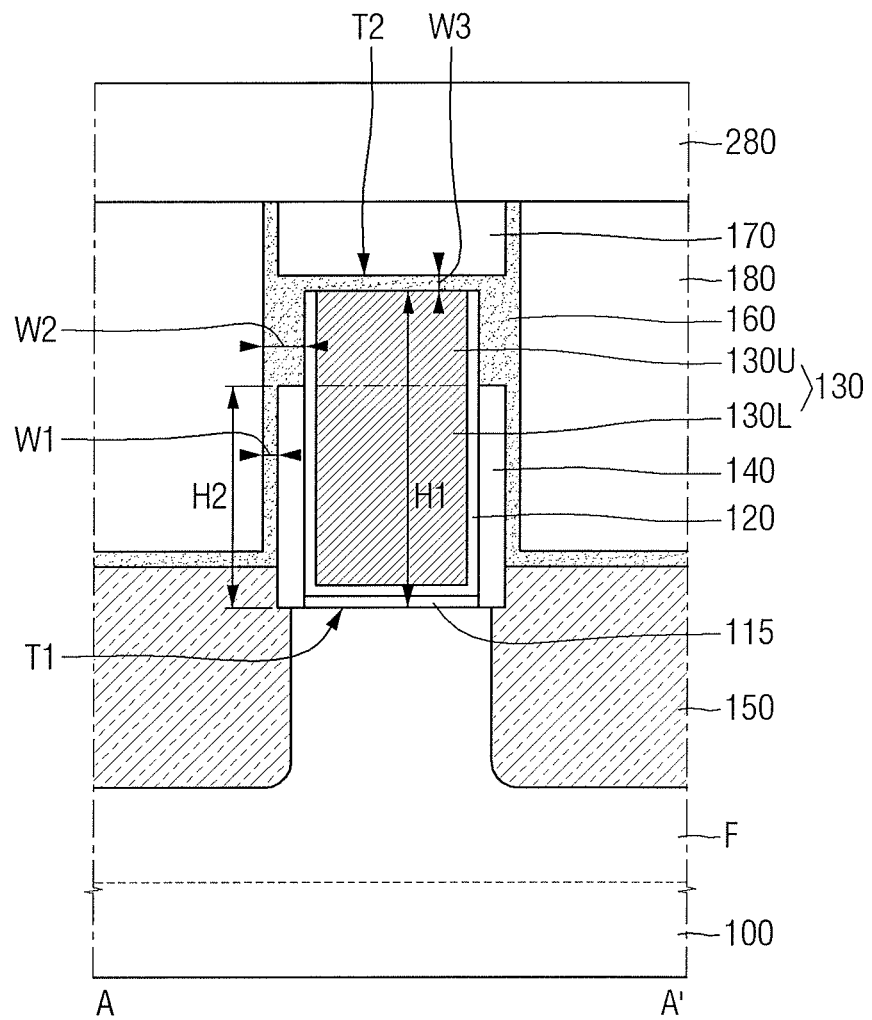
FIG. 2 illustrates a cross-sectional view taken along line A-A' of FIG. 1.
Figure 3:
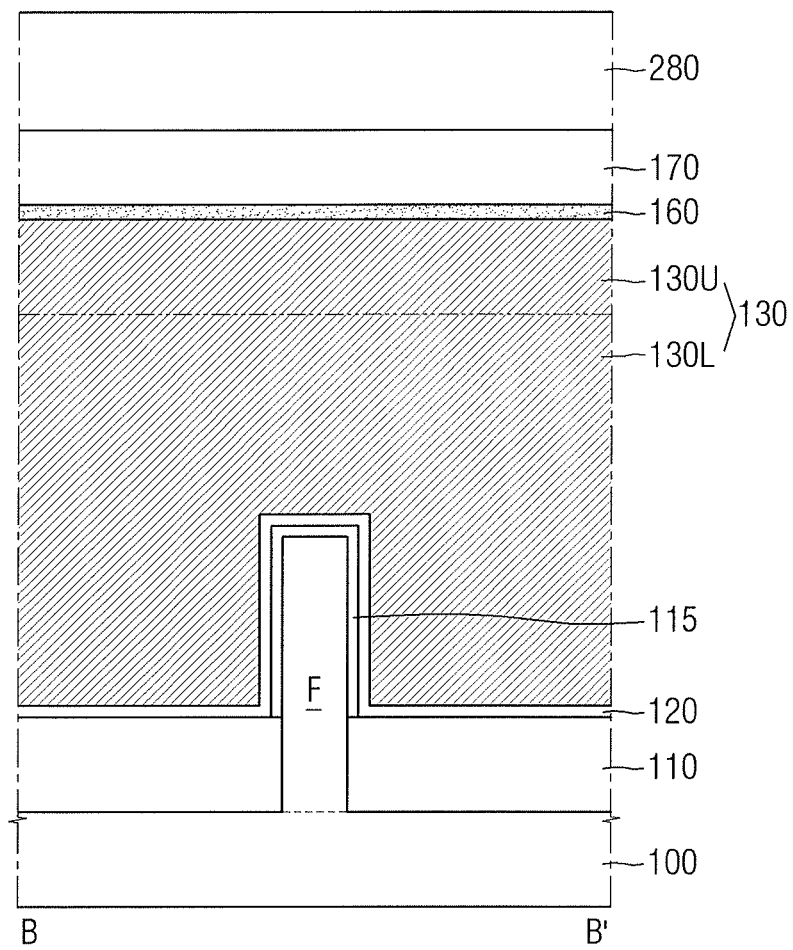
FIG. 3 illustrates a cross-sectional view taken along line B-B' of FIG. 1.

Referring to FIGS. 1 to 3, the semiconductor device according to some embodiments includes a substrate 100, a field insulating layer 110, an interfacial layer 115, a gate dielectric layer 120, a gate electrode 130, a first spacer 140, a source/drain region 150, an etching stop layer 160, a capping pattern 170, a first interlayer insulating layer 180, and a second interlayer insulating layer 280.

The substrate 100 may be, e.g., bulk silicon or silicon-on-insulator (SOI). For example, the substrate 100 may be a silicon substrate or may include other materials, e.g., silicon germanium, indium antimonide, lead tellurium compound, indium arsenide, indium phosphide, gallium arsenide or gallium antimonide. In another example, the substrate 100 may have an epitaxial layer formed on a base substrate. Hereinafter, for convenience of explanation, the substrate 100 is illustrated as being a silicon substrate.

The substrate 100 may include a fin type pattern F. The fin type pattern F may protrude from the upper part of the substrate 100 to extend long. For example, the fin type pattern F may have a longitudinal direction extending along a first direction X on the substrate 100. The fin type pattern F may be a part of the substrate 100 and may also include an epitaxial layer grown from the substrate 100.

The fin type pattern F may include, e.g., silicon or germanium which is an element semiconductor material. Further, the fin type pattern F may include a compound semiconductor, e.g., a group IV-IV compound semiconductor or a group III-V compound semiconductor.

As an example, in a case where the fin type pattern F contains a group IV-IV compound semiconductor, the fin type pattern may include a binary compound or a ternary compound containing at least two or more of carbon (C), silicon (Si), germanium (Ge), and tin (Sn), or a compound obtained by doping these elements with a group IV element. As an example, in a case where the fin type pattern F includes a group III-V compound semiconductor, the fin type pattern F may include one of a binary compound, a ternary compound or a quaternary compound formed by combination of at least one of, e.g., aluminum (Al), gallium (Ga) and indium (In) as a group III element, and at least one of, e.g., phosphorus (P), arsenic (As) and antimony (Sb) as a group V element.

In the present specification, a channel region of the transistor including the gate electrode 130 is described as including a fin type pattern F, but the present disclosure is not limited thereto. For example, the channel region of the transistor including the gate electrode 130 may include, e.g., a nanowire pattern, a nanosheet pattern, or the like.

The field insulating layer 110 may be formed on the substrate 100. Further, the field insulating layer 110 may wrap, e.g., extend along, a part of the side wall of the fin type pattern F. For example, the fin type pattern F may be defined by the field insulating layer 110. In FIG. 1, the side wall of the fin type pattern F is illustrated as being wrapped by the field insulating layer 110 as a whole, but this is only for convenience of description, and the present disclosure is not limited thereto. The field insulating layer 110 may include, but is not limited to, at least one of, e.g., an oxide layer, a nitride layer, an oxynitride layer, and a combination thereof.

The interfacial layer 115 may be interposed between the substrate 100 and the gate dielectric layer 120. For example, as illustrated in FIG. 3, the interfacial layer 115 may extend along the side wall and the upper surface of the fin type pattern F exposed by the field insulating layer 110. FIG. 2 illustrates a configuration in which the interfacial layer 115 is formed only on the upper surface of the fin type pattern F, but the present disclosure is not limited thereto. In some embodiments, the interfacial layer 115 may be formed not only on the upper surface of the fin type pattern F but also on the side wall of the first spacer 140. Also, in some embodiments, the interfacial layer 115 may be omitted.

The interfacial layer 115 may include. e.g., silicon oxide. However, the interfacial layer 115 may contain other materials, depending on the type of the substrate 100, the type of the fin type pattern F, the type of the gate dielectric layer 120 or the like.

The gate electrode 130 may be formed on the substrate 100 and the field insulating layer 110. Further, the gate electrode 130 may intersect with the fin type pattern F. For example, as illustrated in FIG. 1, the gate electrode 130 may have a longitudinal direction extending along a second direction Y intersecting with the first direction X on the fin type pattern F.

The gate electrode 130 may include a conductive material. Further, the gate electrode 130 may be formed by stacking a plurality of conductive materials. For example, the gate electrode 130 may include a metal layer. For example, the gate electrode 130 may include at least one of Ti, Ta, W, Al, Co and combinations thereof. In another example, the gate electrode 130 may be made of silicon, silicon germanium or the like rather than metal. The gate electrode 130 may be formed, e.g., through a replacement process, but the present disclosure is not limited thereto.

The gate dielectric layer 120 may be interposed between the substrate 100 and the gate electrode 130. For example, the gate dielectric layer 120 may extend along the side wall and a lower surface of the gate electrode 130. However, the present disclosure is not limited thereto, and the gate dielectric layer 120 may be formed only on the lower surface of the gate electrode 130. Further, the gate dielectric layer 120 may be formed on the interfacial layer 115 and the field insulating layer 110. As illustrated, in some embodiments, the gate dielectric layer 120 may protrude upward from, e.g., extend above, the upper surface of the first spacer 140.

The gate dielectric layer 120 may include, e.g., at least one of silicon oxide, silicon oxynitride, silicon nitride, or a high dielectric constant (high-k) material having a dielectric constant higher than silicon oxide. The high dielectric constant material may include, e.g., at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

The first spacer 140 may be formed on the substrate 100 and the field insulating layer 110. Further, the first spacer 140 may be formed on both side walls of the gate electrode 130. Thus, the first spacer 140 may intersect with the fin type pattern F. For example, the first spacer 140 may have a longitudinal direction extending along the second direction Y on the side wall of the gate electrode 130.

The first spacer 140 may be formed on a part of the side wall of the gate electrode 130. For example, the height of the upper surface of the first spacer 140 may be lower than the height of the upper surface of the gate electrode 130, e.g., relatively to the upper surface of the fin type pattern F. For example, as illustrated in FIG. 2, a first height H1 from the upper surface of the fin type pattern F to the upper surface of the gate electrode 130 may be higher than a second height H2 from the upper surface of the fin type pattern F to the upper surface of the first spacer 140.

Accordingly, the gate electrode 130 may include a lower part 130L surrounded by the first spacer 140, e.g., tops of the lower part 130L and the first spacer 140 may be level with each other, and an upper part 130U not surrounded by the first spacer 140, e.g., the upper part 130U may extend from the lower part 130L above the first spacer 140. That is, the gate electrode 130 may protrude beyond the upper surface of the first spacer 140.

The first spacer 140 may be formed by, e.g., a recess process of recessing the upper part of the first spacer 140. This will be described later in detail with reference to FIG. 23.

The first spacer 140 may define a first trench T1 on the substrate 100 (FIG. 2). For example, the first trench T1 defined by the upper surface of the fin type pattern F, the upper surface of the field insulating layer 110, and the side wall of the first spacer 140 may be formed. Since the first spacer 140 may intersect with the fin type pattern F, the first trench T1 may also intersect with the fin type pattern F. At this time, the gate electrode 130 may be formed to fill the first trench T1. For example, as illustrated in FIG. 2, the lower part 130L of the gate electrode 130 may fill the first trench T1.

The source/drain region 150 may be formed on the fin type pattern F on the side wall of the gate electrode 130. However, the source/drain region 150 may be insulated from the gate electrode 130. The source/drain region 150 may function as a source/drain of the transistor including the gate electrode 130.

The source/drain region 150 may include an epitaxial layer formed in the fin type pattern F. Further, the source/drain region 150 may also be a raised source/drain region including an upper surface protruding above the upper surface of the substrate 100. However, the present disclosure is not limited thereto, and the source/drain region 150 may be an impurity region formed in the substrate 100.

In FIG. 1, the cross-section of the source/drain region 150 is illustrated as having a pentagonal shape, but the present disclosure is not limited thereto. The cross-section of the source/drain region 150 may have various shapes, e.g., a diamond shape (or a hexagonal shape).

When the semiconductor device according to some embodiments is a PMOS transistor, the source/drain region 150 may contain a p-type impurity or impurity for preventing diffusion of the p-type impurity. For example, the source/drain region 150 may include at least one of B, C, In, Ga, and Al or combinations thereof.

Also, when the semiconductor device according to some embodiments is a PMOS transistor, the source/drain region 150 may include a compressive stress material. For example, when the fin type pattern F is Si, the source/drain region 150 may include a material having a lattice constant larger than Si, e.g., SiGe. The compressive stress material may apply a compressive stress to the fin type pattern F to improve the mobility of the carriers in the channel region.

Alternatively, when the semiconductor device according to some embodiments is an NMOS transistor, the source/drain region 150 may contain n-type impurities or impurities for preventing diffusion of n-type impurities. For example, the source/drain region 150 may include at least one of P, Sb, As, or a combination thereof.

Further, when the semiconductor device according to some embodiments is an NMOS transistor, the source/drain region 150 may include a tensile stress material. For example, when the fin type pattern F is Si, the source/drain region 150 may include a material having a lattice constant smaller than Si, e.g., SiC. The tensile stress material may apply a tensile stress to the fin type pattern F, thereby improving the mobility of carriers in the channel region.

Although the source/drain region 150 is illustrated as a single layer, the present disclosure is not limited thereto. For example, the source/drain region 150 may be formed of multi-layers containing different concentrations of impurities.

The etching stop layer 160 may be formed on the gate electrode 130 and the first spacer 140. Further, the etching stop layer 160 may extend along the side wall and the upper surface of the upper part 130U of the gate electrode 130.

In some embodiments, the etching stop layer 160 may extend along the side walls of the first spacers 140. Also, in some embodiments, the etching stop layer 160 may be formed on the field insulating layer 110 and the source/drain region 150. For example, as illustrated in FIGS. 1 and 2, the etching stop layer 160 may extend along the side walls and the upper surface of the upper part 130U of the gate electrode 130, the side walls of the first spacer 140, the upper surface of the field insulating layer 110 and the outer surface of the source/drain region 150.

In some embodiments, the thickness of the etching stop layer 160 on the side wall of the first spacer 140 along the first direction X may be smaller than the thickness of the etching stop layer 160 on the side wall of the upper part 130U of the gate electrode 130 along the first direction X. For example, as illustrated in FIG. 2, the first thickness W1 of the etching stop layer 160 on the side wall of the first spacer 140 may be smaller than the second thickness W2 of the etching stop layer 160 on the side wall of the upper part 130U of the gate electrode 130.

In FIG. 2, the thickness of the etching stop layer 160 on the side wall of the first spacer 140 is illustrated as being substantially the same as the thickness of the etching stop layer 160 on the upper surface of the gate electrode 130 along a third Z direction. However, the present disclosure is not limited thereto. For example, in some embodiments, the first thickness W1 of the etching stop layer 160 on the side walls of the first spacers 140 may be different from a third thickness W3 of the etching stop layer 160 on the upper surface of the gate electrode 130.

Figure 26:
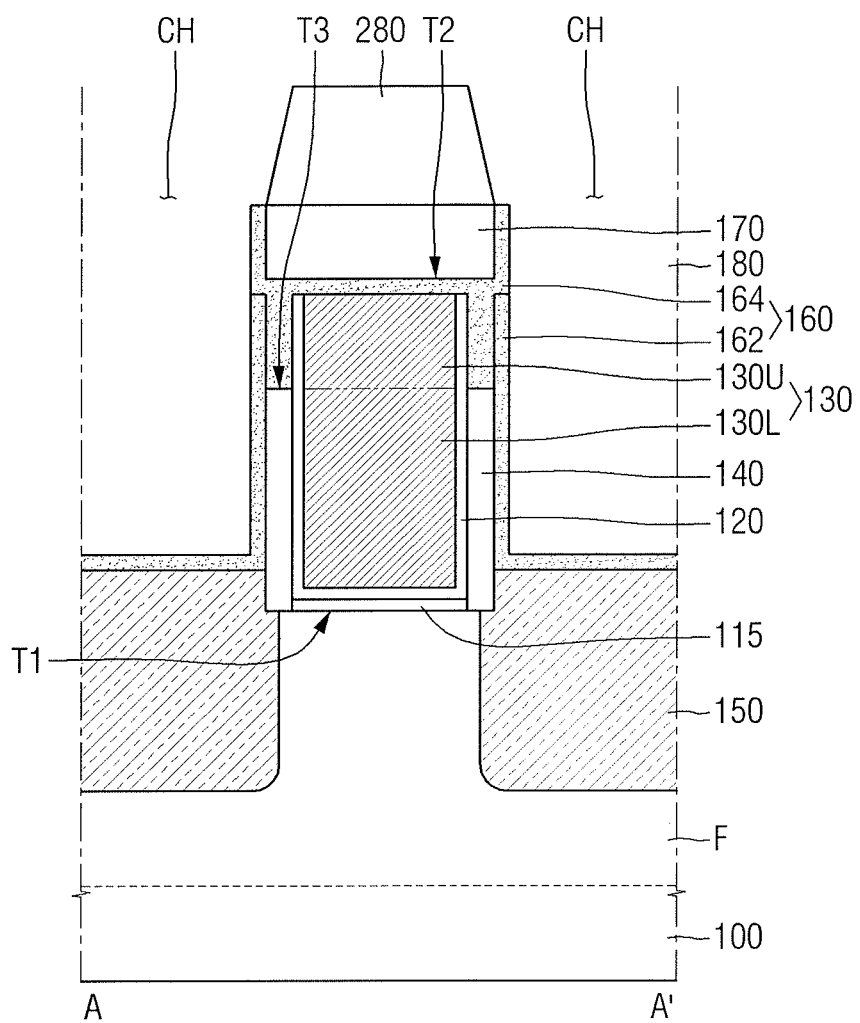

The etching stop layer 160 may include a material having excellent etching resistance in an etching process used for forming a contact hole (e.g., a contact hole CH of FIG. 26). For example, the etching stop layer 160 may include a material having an etching selectivity with respect to the first interlayer insulating layer 180 and the second interlayer insulating layer 280 in the etching process of forming the contact hole. For example, the etching stop layer 160 may include at least one of aluminum oxide, aluminum nitride, silicon carbide, and combinations thereof.

In some embodiments, the etching stop layer 160 may include an aluminum oxide. The aluminum oxide may have excellent etching resistance in the etching process used for forming the contact hole, but it may be easily removed. For example, the aluminum oxide may be easily removed by a wet etching process. Thus, the semiconductor device according to some embodiments may include the etching stop layer 160 in which the thickness adjustment is easy.

The capping pattern 170 may be formed on the etching stop layer 160. Further, the capping pattern 170 may intersect with the fin type pattern F. For example, the capping pattern 170 may have a longitudinal direction extending along the second direction Y over the etching stop layer 160.

In some embodiments, the capping pattern 170 may fill a second trench T2 in the etching stop layer 160. The second trench T2 may be formed in the etching stop layer 160 on the gate electrode 130. As a result, the etching stop layer 160 may extend along the side wall and the lower surface of the capping pattern 170.

In some embodiments, the capping pattern 170 may have a lower dielectric constant than the dielectric constant of the etching stop layer 160. As a result, the capping pattern 170 may effectively reduce the parasitic capacitance or leakage current between the gate electrode 130 and the source/drain contact (e.g., a contact 190 of FIGS. 11 through 16). For example, the capping pattern 170 may include silicon nitride.

In some embodiments, the etching stop layer 160 may include excellent etching resistance compared to the capping pattern 170, in the etching process of forming the contact hole (e.g., the contact hole CH of FIG. 26). For example, the etching stop layer 160 may include a material having an etching selectivity with respect to the capping pattern 170 in the etching process of forming the contact hole.

The first interlayer insulating layer 180 may be formed on the substrate 100. Further, the first interlayer insulating layer 180 may surround the etching stop layer 160. Thus, the first interlayer insulating layer 180 may surround the gate electrode 130 and the first spacer 140.

In FIGS. 1 and 2, the upper surface of the first interlayer insulating layer 180 is illustrated as being disposed on the same plane as, e.g., level with, the upper surface of the etching stop layer 160 and the upper surface of the capping pattern 170, but the present disclosure is not limited thereto. For example, the upper surface of the first interlayer insulating layer 180 may be higher or lower than the upper surface of the etching stop layer 160 or the upper surface of the capping pattern 170.

The second interlayer insulating layer 280 may be formed on the first interlayer insulating layer 180. Further, the second interlayer insulating layer 280 may cover the upper surface of the etching stop layer 160 and the upper surface of the capping pattern 170.

For example, the first interlayer insulating layer 180 and the second interlayer insulating layer 280 may include at least one of silicon oxide, silicon nitride, silicon oxynitride and a low dielectric constant (low-k) material having a dielectric constant lower than that of silicon oxide. The low dielectric constant material may include, but is no limited to, e.g., at least one of FOX (Flowable Oxide), TOSZ (Torene SilaZene), USG (Undoped Silica Glass), BSG (Borosilica Glass), PSG (PhosphoSilica Glass), BPSG (Boro Phospho Silica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof.

A self-aligned contact (SAC) process is used to form a contact of fine pitches. However, with high integration of the semiconductor device, a short circuit may occur due to insufficient selectivity between the layer qualities at the time of forming the contact hole in the self-aligned contact process. For example, when forming a contact hole for forming a source/drain contact of a transistor by utilizing the self-aligned contact process, a short circuit may occur between the gate electrode and the source/drain contact due to insufficient selectivity between the layer qualities.

However, the semiconductor device according to example embodiments may effectively prevent short-circuit between the gate electrode 130 and the source/drain contact (e.g., the contact 190 of FIGS. 11 through 16), using the etching stop layer 160 for protecting the upper part 130U of the gate electrode 130. For example, the etching stop layer 160 may include a material having excellent etching resistance to protect the side wall and the upper surface of the upper part 130U of the gate electrode 130. As a result, in the process of forming the contact hole (e.g., the contact hole CH of FIG. 26) for the source/drain contact (e.g., the contact 190 of FIGS. 11 through 16), the gate electrode 130 can be effectively protected, and a semiconductor device with improved reliability and process margin can be provided.

Figure 4:
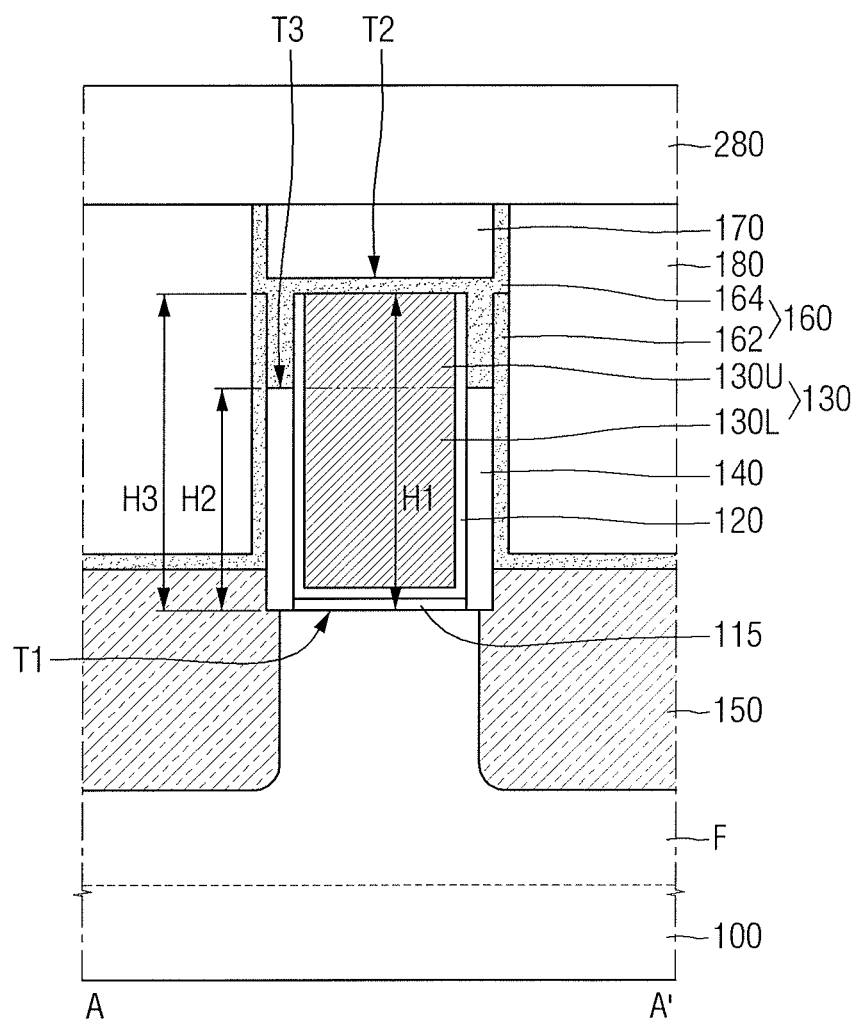
FIG. 4 illustrates a cross-sectional view of a semiconductor device according to some embodiments.

FIG. 4 is a cross-sectional view of a semiconductor device according to some embodiments. It is noted that FIG. 4 corresponds to a cross-sectional view along line A-A' of FIG. 1. For the sake of convenience of explanation, repeated parts of those described with reference to FIGS. 1 to 3 will be only briefly explained or omitted.

Referring to FIG. 4, in the semiconductor device according to some embodiments, the etching stop layer 160 includes a first etching stop layer 162 and a second etching stop layer 164.

The first etching stop layer 162 may be formed on a side wall of the first spacer 140. Further, similar to the etching stop layer 160 of FIGS. 1 to 3, the first etching stop layer 162 may also be formed on the field insulating layer 110 and the source/drain region 150.

In some embodiments, the height of the first etching stop layer 162 may be smaller than the height of the first spacer 140. For example, as illustrated in FIG. 4, the third height H3 from the upper surface of the fin type pattern F to the upper surface of the first etching stop layer 162 may be higher than the second height H2 from the upper surface of the fin type pattern F to the upper surface of the first spacer 140. As a result, the first etching stop layer 162 may protrude upward from, e.g., above, the upper surface of the first spacer 140. Further, a third trench T3 defined by the side wall of the first etching stop layer 162, the upper surface of the first spacer 140, and the side wall of the gate dielectric layer 120 may be formed.

In some embodiments, the height of the first etching stop layer 162 may be substantially the same as the height of the gate electrode 130. For example, as illustrated, the third height H3 from the upper surface of the fin type pattern F to the upper surface of the first etching stop layer 162 may be substantially the same as the first height H1 from the upper surface of the fin type pattern F to the upper surface of the gate electrode 130.

The second etching stop layer 164 may extend along the side wall and the upper surface of the upper part 130U of the gate electrode 130. For example, the second etching stop layer 164 may be formed on the first etching stop layer 162, the first spacer 140, the gate dielectric layer 120 and the gate electrode 130.

In some embodiments, the second etching stop layer 164 may be formed to fill the third trench T3. Accordingly, the first etching stop layer 162 and the second etching stop layer 164 may overlap on the side wall of the upper part 130U of the gate electrode 130. The second etching stop layer 164 is illustrated as completely filling the third trench T3, but the present disclosure is not limited thereto. In some embodiments, the second etching stop layer 164 may fill only a part of the third trench T3. Alternatively, in some embodiments, the second etching stop layer 164 may also include a void or an air gap in the third trench T3.

In some embodiments, the second trench T2 may be formed in the second etching stop layer 164 on the gate electrode 130. As a result, the second etching stop layer 164 may extend along the side wall and the lower surface of the capping pattern 170.

In some embodiments, the first etching stop layer 162 and the second etching stop layer 164 may include substantially the same material. However, the present disclosure is not limited thereto, and the first etching stop layer 162 and the second etching stop layer 164 may include materials different from each other.

Figure 5:
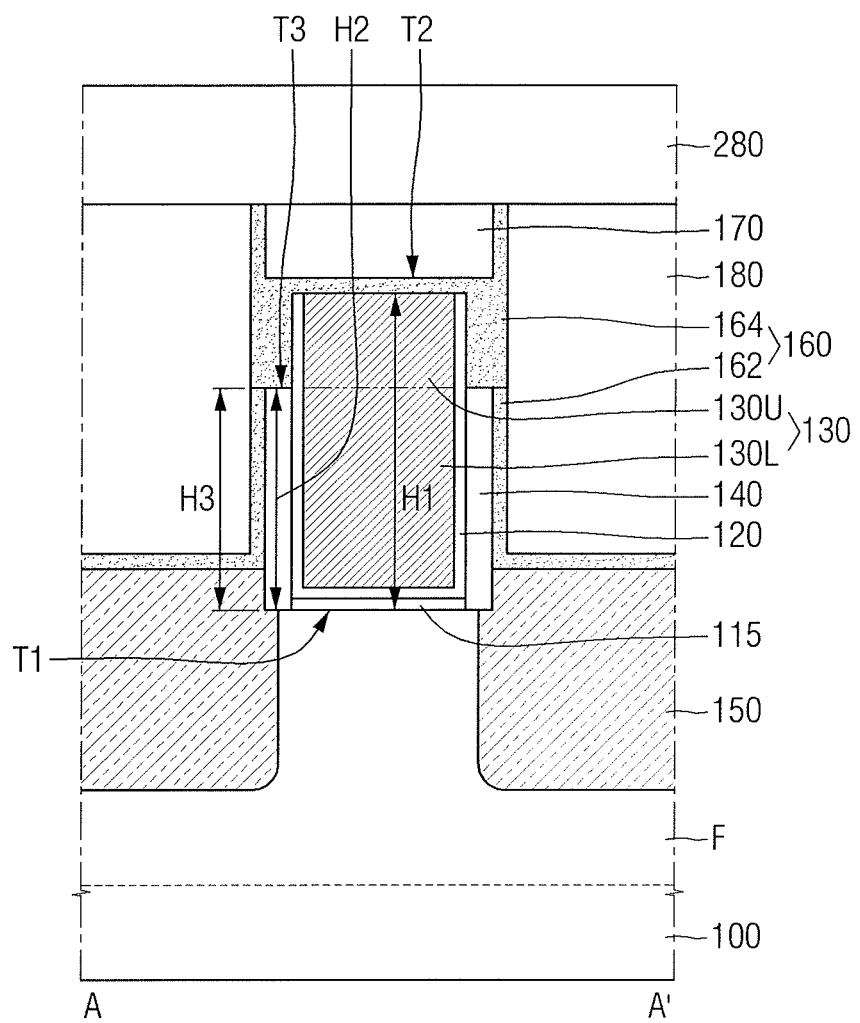
FIG. 5 illustrates a cross-sectional view of a semiconductor device according to some embodiments.

FIG. 5 is a cross-sectional view of the semiconductor device according to some embodiments. It is noted that FIG. 5 corresponds to a cross-sectional view along line A-A' of FIG. 1. For the sake of convenience of explanation, repeated parts of those described with reference to FIGS. 1 to 4 will be only briefly explained or omitted.

Referring to FIG. 5, in the semiconductor device according to some embodiments, the height of the first etching stop layer 162 is lower than the height of the gate electrode 130. For example, as illustrated in FIG. 5, the third height H3 from the upper surface of the fin type pattern F to the upper surface of the first etching stop layer 162 may be lower than the first height H1 from the upper surface of the fin type pattern F to the upper surface of the gate electrode 130.

The third height H3 of the first etching stop layer 162 is illustrated as being the same as the second height H2 of the first spacer 140, but the present disclosure is not limited thereto. For example, the third height H3 of the first etching stop layer 162 may be higher or lower than the second height H2 of the first spacer 140, depending on the characteristics of the recess process for recessing the upper part of the first spacer 140.

Figure 6:
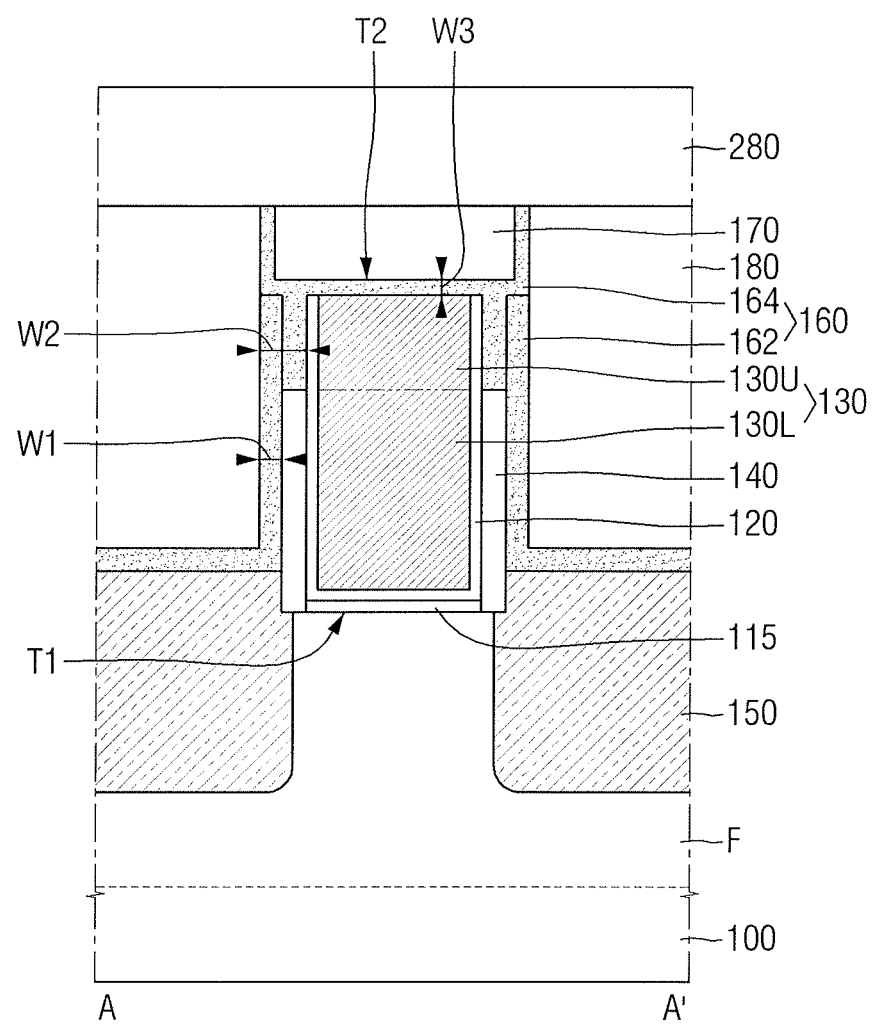
FIG. 6 illustrates a cross-sectional view of a semiconductor device according to some embodiments.

FIG. 6 is a cross-sectional view of the semiconductor device according to some embodiments. It is noted that FIG. 6 corresponds to a cross-sectional view along line A-A' of FIG. 1. For the sake of convenience of explanation, repeated parts of those described with reference to FIGS. 1 to 4 will be only briefly explained or omitted.

Referring to FIG. 6, in the semiconductor device according to some embodiments, the thickness of the etching stop layer 160 on the side wall of the first spacer 140 is greater than the thickness of the etching stop layer 160 on the upper surface of the gate electrode 130. For example, as illustrated in FIG. 6, the first thickness W1 of the first etching stop layer 162 on the side wall of the first spacer 140 may be greater than the third thickness W3 of the second etching stop layer 164 on the upper surface of the gate electrode 130.

However, the first thickness W1 of the first etching stop layer 162 may be smaller than the second thickness W2 of the etching stop layer 160 on the side wall of the upper part 130U of the gate electrode 130. This is because the first etching stop layer 162 and the second etching stop layer 164 may overlap on the side wall of the upper part 130U of the gate electrode 130.

Figure 7:
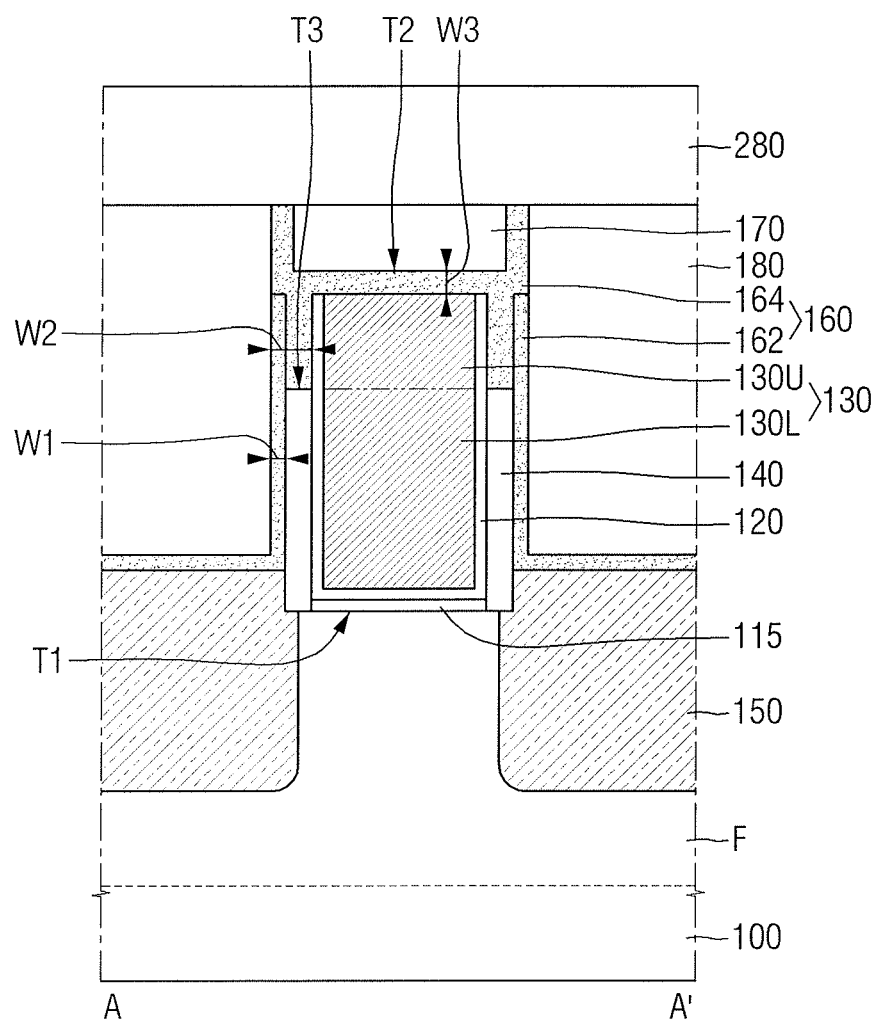
FIG. 7 illustrates a cross-sectional view of a semiconductor device according to some embodiments.

FIG. 7 is a cross-sectional view of the semiconductor device according to some embodiments. It is noted that FIG. 7 corresponds to a cross-sectional view along line A-A' of FIG. 1. For the sake of convenience of explanation, repeated parts of those described with reference to FIGS. 1 to 4 will be only briefly explained or omitted.

Referring to FIG. 7, in the semiconductor device according to some embodiments, the thickness of the etching stop layer 160 on the upper surface of the gate electrode 130 is greater than the thickness of the etching stop layer 160 on the side wall of the first spacer 140. For example, as illustrated in FIG. 7, the third thickness W3 of the second etching stop layer 164 on the upper surface of the gate electrode 130 may be greater than the first thickness W1 of the first etching stop layer 162 on the side wall of the first spacer 140.

The third thickness W3 of the second etching stop layer 164 is illustrated as being smaller than the second thickness W2 of the etching stop layer 160 on the side wall of the upper part 130U of the gate electrode 130, but the present disclosure is not limited thereto. For example, the third thickness W3 may be greater than the second thickness W2, depending on the thickness at which the second etching stop layer 164 is formed.

Figure 8:
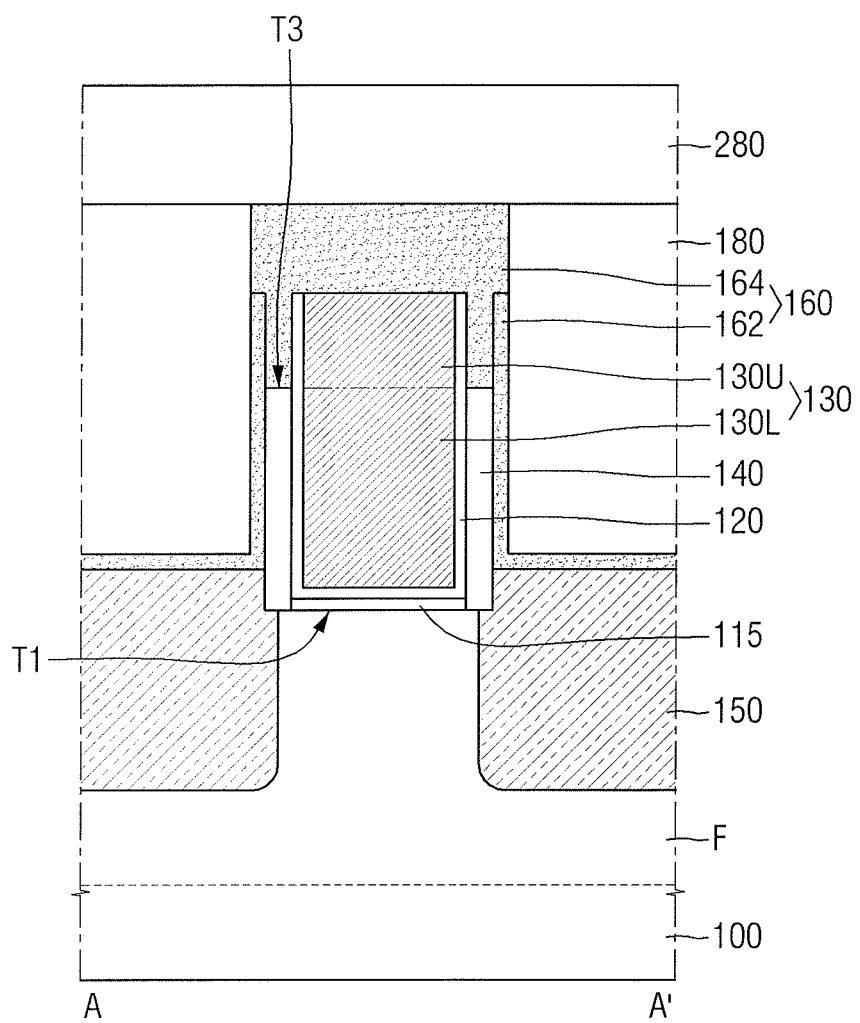
FIG. 8 illustrates a cross-sectional view of a semiconductor device according to some embodiments.

FIG. 8 is a cross-sectional view of the semiconductor device according to some embodiments. It is noted that FIG. 8 corresponds to a cross-sectional view along line A-A' of FIG. 1. For the sake of convenience of explanation, repeated parts of those described with reference to FIGS. 1 to 4 will be only briefly explained or omitted.

Referring to FIG. 8, the semiconductor device according to some embodiments does not include the capping pattern 170. For example, as illustrated in FIG. 8, the second etching stop layer 164 may not include the second trench T2 of FIGS. 1 to 4. As a result, the second etching stop layer 164 on the upper surface of the gate electrode 130 may be formed to be thicker along the vertical direction (i.e., the third direction Z of FIG. 2).

Figure 9:
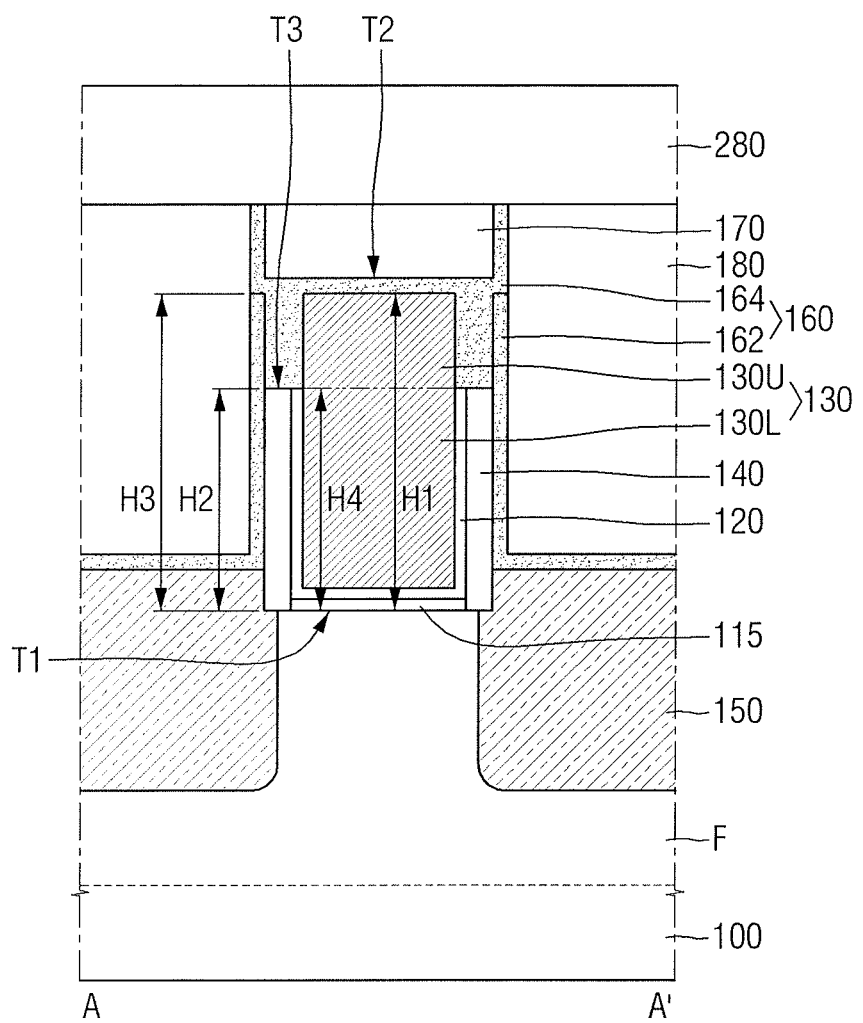
FIG. 9 illustrates a cross-sectional view of a semiconductor device according to some embodiments.

FIG. 9 is a cross-sectional view of the semiconductor device according to some embodiments. It is noted that FIG. 9 corresponds to a cross-sectional view along line A-A' of FIG. 1. For the sake of convenience of explanation, repeated parts of those described with reference to FIGS. 1 to 4 will be only briefly explained or omitted.

Referring to FIG. 9, in the semiconductor device according to some embodiments, the height of the gate dielectric layer 120 is lower than the height of the gate electrode 130. For example, as illustrated in FIG. 9, a fourth height H4 from the upper surface of the fin type pattern F to the upper surface of the gate dielectric layer 120 may be lower than the first height H1 from the upper surface of the fin type pattern F to the upper surface of the gate electrode 130. Accordingly, in some embodiments, the third trench T3 may be defined by the side walls of the first etching stop layer 162, the upper surface of the first spacer 140 and the side walls of the gate electrode 130.

The fourth height H4 of the gate dielectric layer 120 is illustrated as being the same as the second height H2 of the first spacer 140, but the present disclosure is not limited thereto. For example, the fourth height H4 of the gate dielectric layer 120 may be higher or lower than the second height H2 of the first spacer 140, depending on the characteristics of the recess process of recessing the upper part of the first spacer 140.

Also, the fourth height 114 of the gate dielectric layer 120 is illustrated as being lower than the third height H3 of the first etching stop layer 162, but embodiments are not limited thereto. For example, the third height H3 of the first etching stop layer 162 may be lower than or the same as the fourth height H4 of the gate dielectric layer 120, depending on the characteristics of the recess process for recessing the upper part of the first spacer 140.

Figure 10:
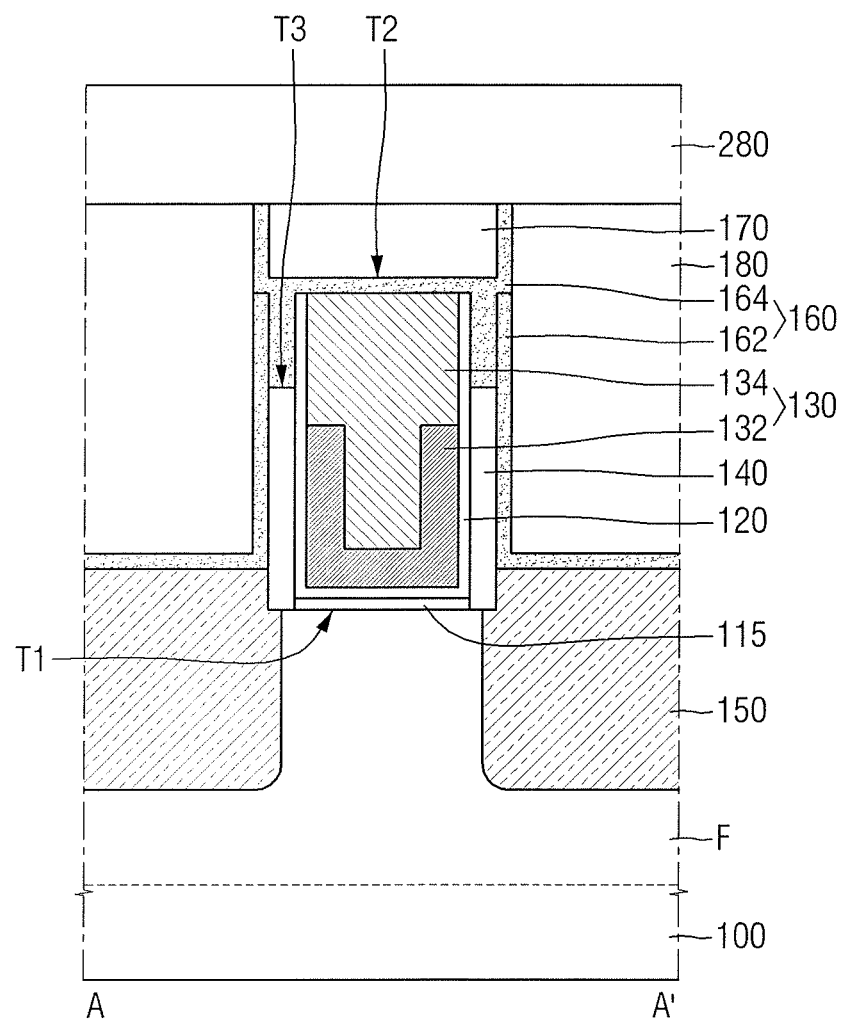
FIG. 10 illustrates a cross-sectional view of a semiconductor device according to some embodiments.

FIG. 10 is a cross-sectional view of the semiconductor device according to some embodiments. It is noted that FIG. 10 corresponds to a cross-sectional view along line A-A' of FIG. 1. For the sake of convenience of explanation, repeated parts of those described with reference to FIGS. 1 to 4 will be only briefly explained or omitted.

Referring to FIG. 10, in the semiconductor device according to some embodiments, the gate electrode 130 is formed of multi-layers. For example, a work function adjustment layer 132 may adjust the work function of the gate electrode 130. The work function adjustment layer 132 is illustrated as being formed of a single layer, but the present disclosure is not limited thereto, and the work function adjustment layer 132 may be formed of multi-layers. A filling conductive layer 134 may fill the space formed by the work function adjustment layer 132.

As illustrated in FIG. 10, in some embodiments, the work function adjustment layer 132 may extend along a part of the side wall of the gate dielectric layer 120. However, the present disclosure is not limited thereto, and the work function adjustment layer 132 may extend along the entire side wall of the gate dielectric layer 120.

The work function adjustment layer 132 may include, e.g., at least one of TiN, TaN, TiC, TaC, TiAlC, and combinations thereof. The filling conductive layer 134 may include, e.g., W or Al.

Figure 11:
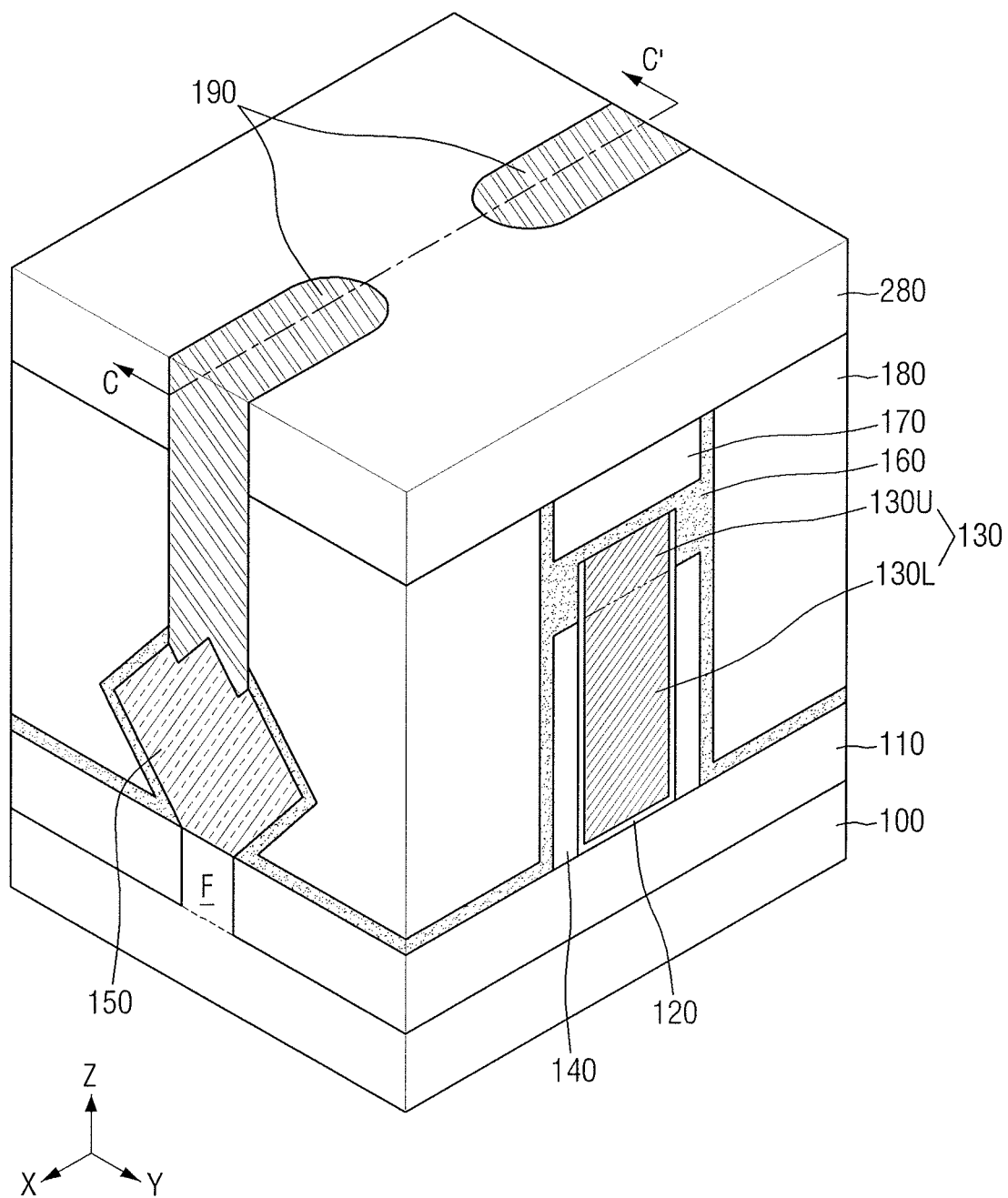
FIG. 11 illustrates a perspective view of a semiconductor device according to some embodiments.
Figure 12:
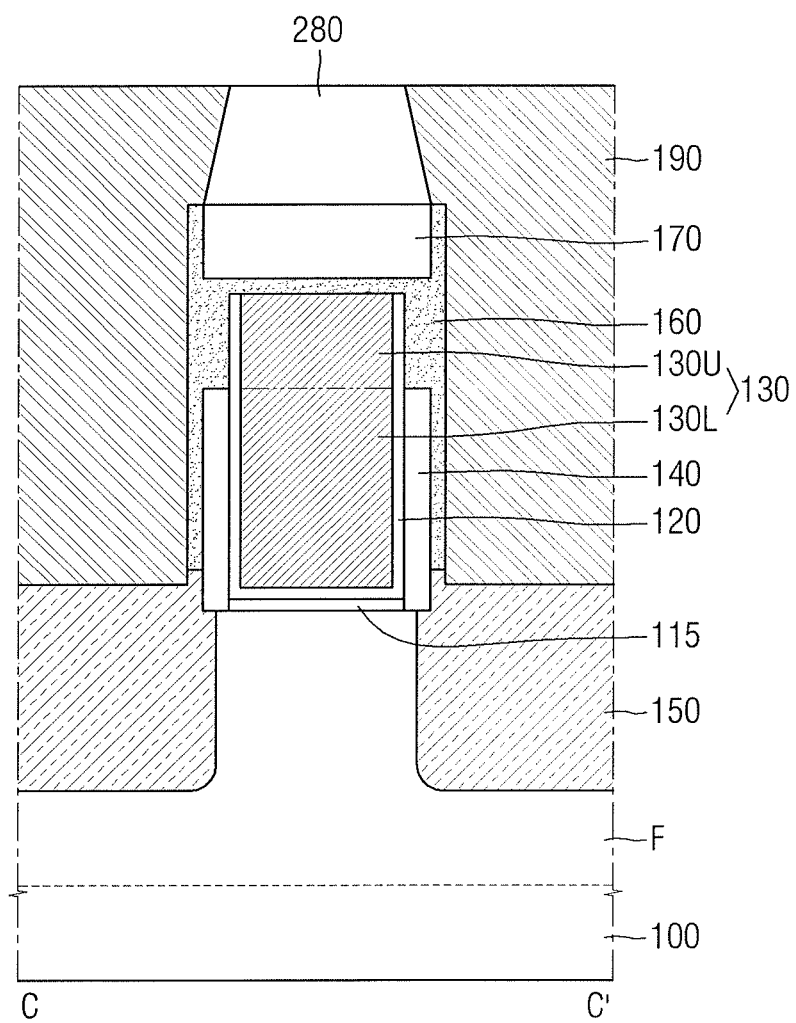
FIG. 12 illustrates a cross-sectional view taken along line C-C' of FIG. 11.

FIG. 11 is a perspective view of a semiconductor device according to some embodiments. FIG. 12 is a cross-sectional view taken along line C-C' of FIG. 11. For the sake of convenience of explanation, repeated parts of those described with reference to FIGS. 1 to 3 will be only briefly explained or omitted.

Referring to FIGS. 11 and 12, the semiconductor device according to some embodiments may further include a contact 190. The contact 190 may be formed to be connected to the source/drain region 150. For example, the contact 190 may be connected to the source/drain region 150 through the first interlayer insulating layer 180, the second interlayer insulating layer 280, and the etching stop layer 160.

A part of the side wall of the contact 190 may be defined by the etching stop layer 160. For example, the etching stop layer 160 may include a material having an etch selectivity with respect to the first interlayer insulating layer 180 and the second interlayer insulating layer 280. The contact 190 may be formed, e.g., by a self-aligned contact (SAC) process.

Figure 13:
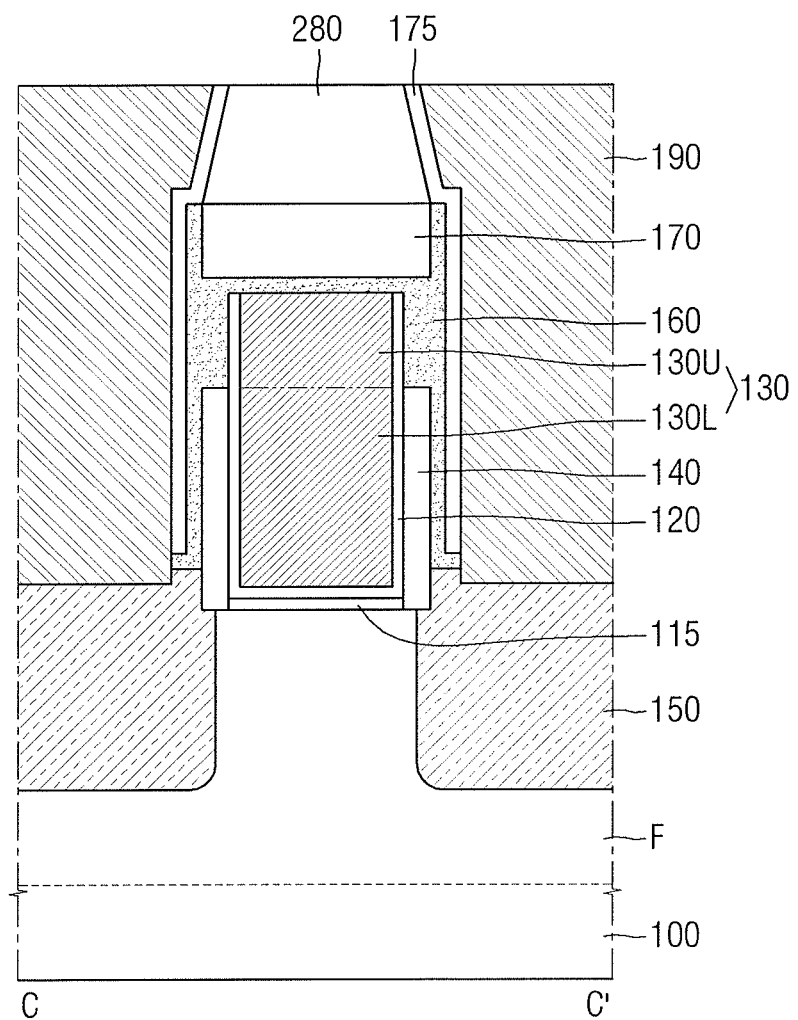
FIG. 13 illustrates a cross-sectional view of a semiconductor device according to some embodiments.

FIG. 13 is a cross-sectional view of the semiconductor device according to some embodiments. It is noted that FIG. 13 corresponds to a cross-sectional view along line C-C' of FIG. 11. For the sake of convenience of explanation, repeated parts of those described with reference to FIGS. 1 to 3, 11, and 12 will be only briefly explained or omitted.

Referring to FIG. 13, the semiconductor device according to some embodiments may further include a second spacer 175. The second spacer 175 may be interposed between the etching stop layer 160 and the contact 190.

For example, the second spacer 175 may extend along the side wall of the etching stop layer 160. In some embodiments, the second spacer 175 may extend along the capping pattern 170 or the second interlayer insulating layer 280.

The second spacer 175 may have a dielectric constant lower than that of the etching stop layer 160. For example, the second spacer 175 may include at least one of, e.g., silicon oxide, silicon nitride, silicon oxynitride and low dielectric constant (low-k) materials having a dielectric constant lower than silicon oxide. As a result, the second spacer 175 may efficiently reduce the parasitic capacitance or the leakage current between the gate electrode 130 and the contact 190.

Figure 14:
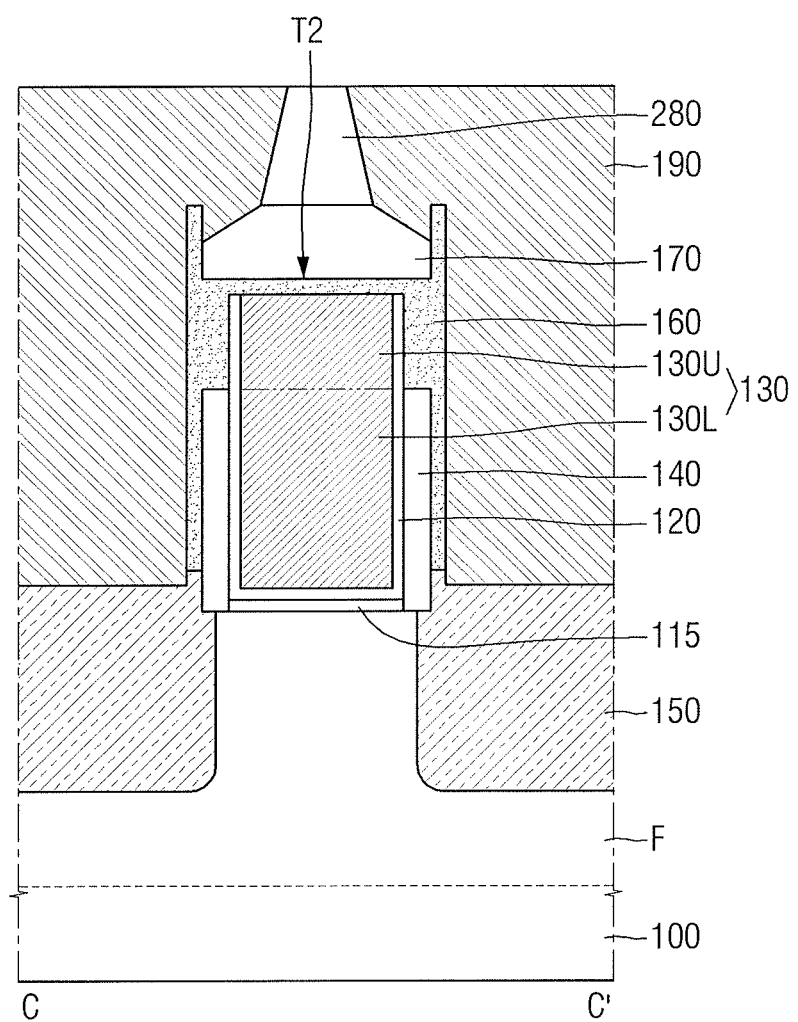
FIG. 14 illustrates a cross-sectional view of a semiconductor device according to some embodiments.

FIG. 14 is a cross-sectional view of the semiconductor device according to some embodiments. It is noted that FIG. 14 corresponds to a cross-sectional view along line C-C' of FIG. 11. For the sake of convenience of explanation, repeated parts of those described with reference to FIGS. 1 to 3, 11, and 12 will be only briefly explained or omitted.

Referring to FIG. 14, in the semiconductor device according to some embodiments, a part of the side wall of the contact 190 is defined by the etching stop layer 160 and the capping pattern 170. For example, a part of the contact 190 may fill a part of the second trench T2 on the capping pattern 170. In some embodiments, the side wall of the contact 190 defined by the capping pattern 170 may have a slope with respect to the upper surface of the substrate 100.

The contact 190 is illustrated as not making direct contact with the lower surface of the second trench T2, but the present disclosure is not limited thereto. For example, the contact 190 may be in contact with both the side wall and the lower surface of the second trench T2l.

The shape of the contact 190 may be attributed, e.g., to the characteristics of the etching process used for forming the contact hole (e.g., the contact hole CH of FIG. 26) for the contact 190. For example, a part of the capping pattern 170 may be etched by the etching process used for forming the contact hole, but the etching stop layer 160 may not be etched. For example, the etching stop layer 160 may have an etching selectivity with respect to the capping pattern 170 in the etching process of forming the contact hole. As a result, the contact 190 may fill a part of the second trench T2 by filling the space formed by the etched capping pattern 170.

Figure 15:
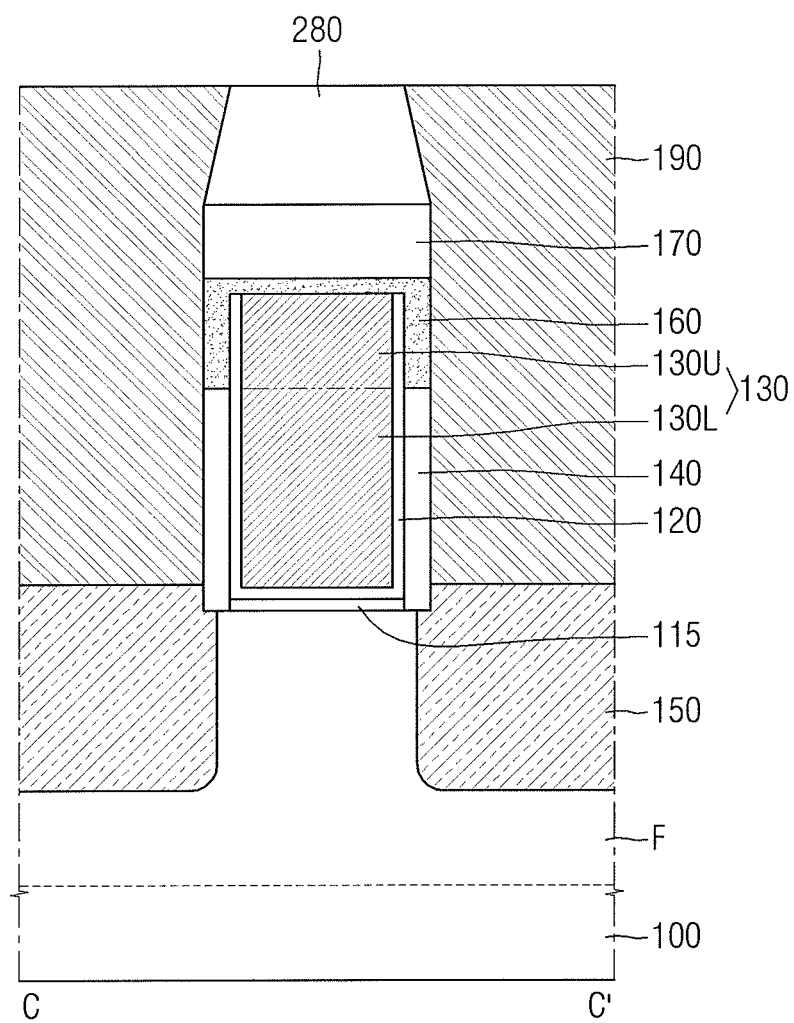
FIG. 15 illustrates a cross-sectional view of a semiconductor device according to some embodiments.

FIG. 15 is a cross-sectional view of the semiconductor device according to some embodiments. It is noted that FIG. 15 corresponds to a cross-sectional view along line C-C' of FIG. 11. For the sake of convenience of explanation, repeated parts of those described with reference to FIGS. 1 to 3, 11, and 12 will be only briefly explained or omitted.

Referring to FIG. 15, in the semiconductor device according to some embodiments, a part of the etching stop layer 160 is removed. For example, as compared with the etching stop layer 160 of FIGS. 1 to 3, 11 and 12, the etching stop layer 160 on the side wall of the first spacer 140 and on the side wall of the capping pattern 170 may be removed. As a result, the etching stop layer 160 may extend along the side wall and upper surface of the upper part 130U of the gate electrode 130. However, the etching stop layer 160 may not extend along the side wall of the first spacer 140 and the side wall of the capping pattern 170.

A space formed by the removed etching stop layer 160 may be filled with the contact 190. That is, the contact 190 having a volume increased as much as the volume of the removed etching stop layer 160 may be provided. Accordingly, the semiconductor device according to some embodiments may provide a contact with reduced electrical resistance.

Figure 16:
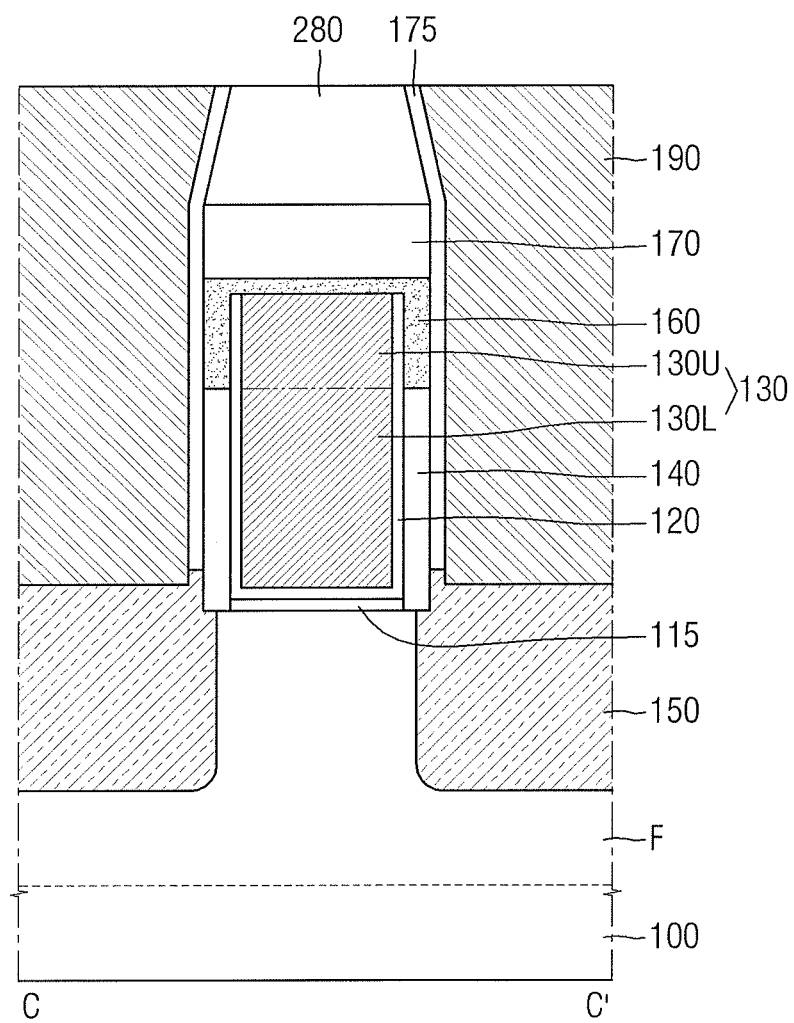
FIG. 16 illustrates a cross-sectional view of a semiconductor device according to some embodiments.

FIG. 16 is a cross-sectional view of the semiconductor device according to some embodiments. It is noted that FIG. 16 corresponds to a cross-sectional view along line C-C' of FIG. 11. For the sake of convenience of explanation, repeated parts of those described with reference to FIGS. 1 to 3, 11, and 12 will be only briefly explained or omitted.

Referring to FIG. 16, the semiconductor device according to some embodiments may further include a second spacer 175. The second spacer 175 may be interposed between the etching stop layer 160 and the contact 190. For example, the second spacer 175 may extend along the side wall of the first spacer 140 and the side wall of the etching stop layer 160.

In some embodiments, the etching stop layer 160 may not extend along the side wall of the first spacer 140. In such a case, the second spacer 175 may come into direct contact with the side wall of the first spacer 140. Likewise, in some embodiments, the etching stop layer 160 may not extend along the side wall of the capping pattern 170. In such a case, the second spacer 175 may come into direct contact with the side wall of the capping pattern 170.

Hereinafter, a method for fabricating a semiconductor device according to some embodiments will be described with reference to FIGS. 17 to 26.

FIGS. 17 to 26 are cross-sectional view of stages in a method for fabricating a semiconductor device according to some embodiments. The cross-sectional views correspond to line A-A' of FIG. 2. For the sake of convenience of explanation, repeated parts of those described with reference to FIGS. 1 to 3, 11, and 12 will be only briefly explained or omitted.

Figure 17:
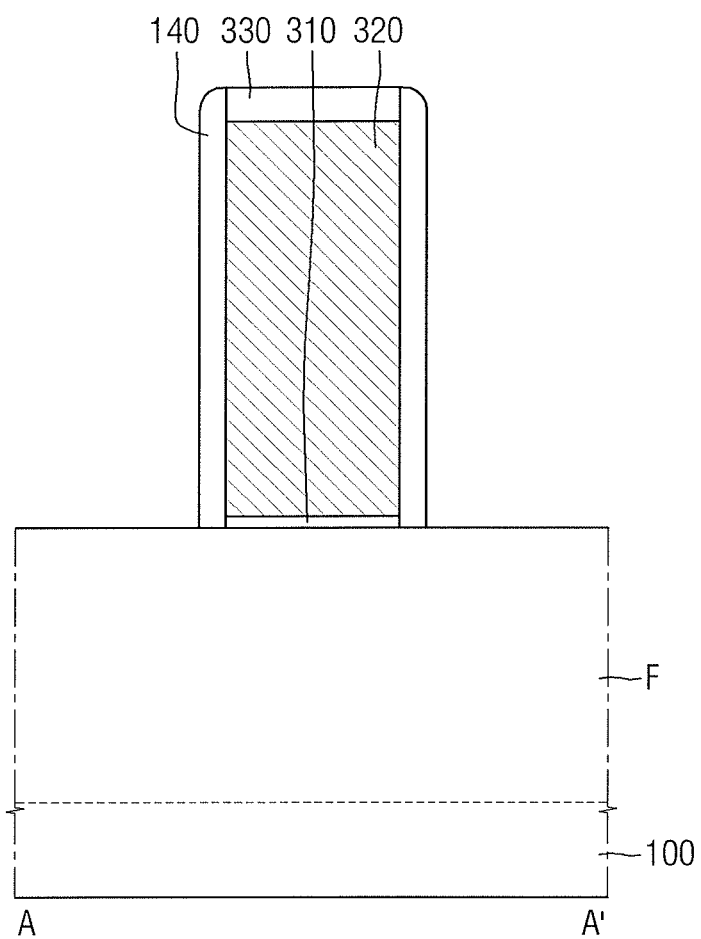
FIGS. 17 to 26 illustrate cross-sectional view of stages in a method for fabricating a semiconductor device according to some embodiments.

Referring to FIG. 17, a dummy gate dielectric layer 310 and a dummy gate electrode 320 are formed on the substrate 100. For example, a dielectric layer and a conductive layer are sequentially formed on the substrate 100, and the insulating layer and the conductive layer may be patterned, using a mask pattern 330. As a result, the dummy gate dielectric layer 310 and the dummy gate electrode 320 patterned on the substrate 100 may be formed.

Subsequently, the first spacer 140 is formed on the side wall of the dummy gate dielectric layer 310 and the side wall of the dummy gate electrode 320. For example, a spacer layer may be formed along the profiles of the substrate 100, the dummy gate dielectric layer 310, the dummy gate electrode 320, and the mask pattern 330. Subsequently, the spacer layer on the upper surface of the substrate 100 and the upper surface of the mask pattern 330 may be removed. Accordingly, the first spacer 140 may be formed on the side wall of the dummy gate dielectric layer 310 and the side wall of the dummy gate electrode 320.

The substrate 100 may include the fin type pattern F. The fin type pattern F may protrude from the upper part of the substrate 100 to extend long. The fin type pattern F may be a part of the substrate 100 and may also include an epitaxial layer grown from the substrate 100.

The fin type pattern F may intersect with the dummy gate electrode 320. For example, the fin type pattern F may extend in the first direction, and the dummy gate electrode 320 may extend in the second direction intersecting with the first direction.

Figure 18:
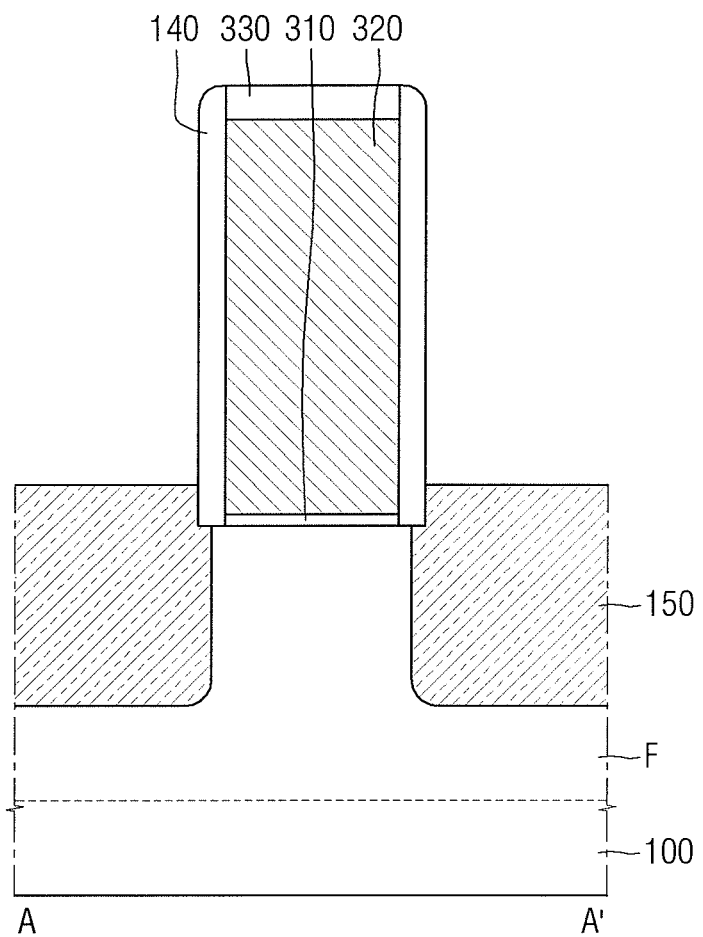

Referring to FIG. 18, the source/drain region 150 is formed on the substrate 100. The source/drain region 150 may be formed in the substrate 100 on the side wall of the gate electrode 130. The source/drain region 150 may include, e.g., an epitaxial layer formed in the fin type pattern F. Also, the source/drain region 150 may be an elevated source and drain region including an upper surface protruding above the upper surface of the substrate 100.

For example, a part of the fin type pattern F may be etched, using an etching process which uses the dummy gate electrode 320 and the first spacer 140 as an etching mask. Subsequently, the source/drain region 150 may be formed in the etched fin type pattern F, using an epitaxial growth method.

Figure 19:
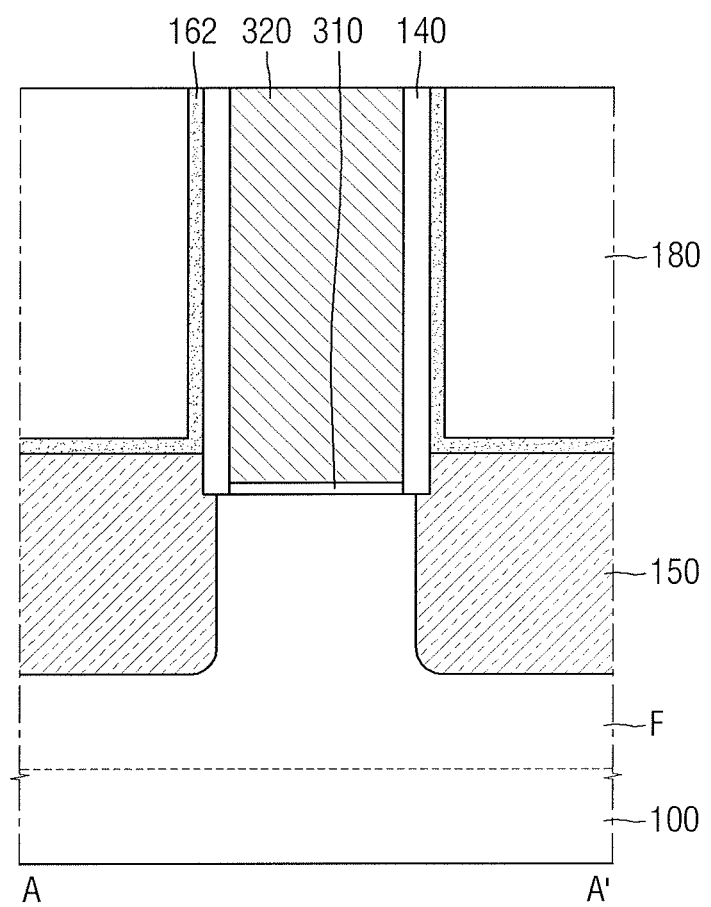

Referring to FIG. 19, the first etching stop layer 162 and the first interlayer insulating layer 180 are formed on the substrate 100.

For example, the first etching stop layer 162 extending along the profiles of the substrate 100, the source/drain region 150, the first spacer 140, and the mask pattern 330 may be formed. The first etching stop layer 162 may include, e.g., at least one of aluminum oxide, aluminum nitride, silicon carbide, and combinations thereof. In some embodiments, the etching stop layer 160 may include an aluminum oxide.

Subsequently, the first interlayer insulating layer 180 may be formed on the substrate 100. The first interlayer insulating layer 180 may be formed to cover the overall first etching stop layer 162.

Subsequently, a planarization process may be performed, until the upper surface of the dummy gate electrode 320 is exposed. The planarization process may include, but is not limited to, e.g., a chemical mechanical polishing (CMP) process. Thus, the first interlayer insulating layer 180 which surrounds the side wall of the first etching stop layer 162 may be formed.

Figure 20:
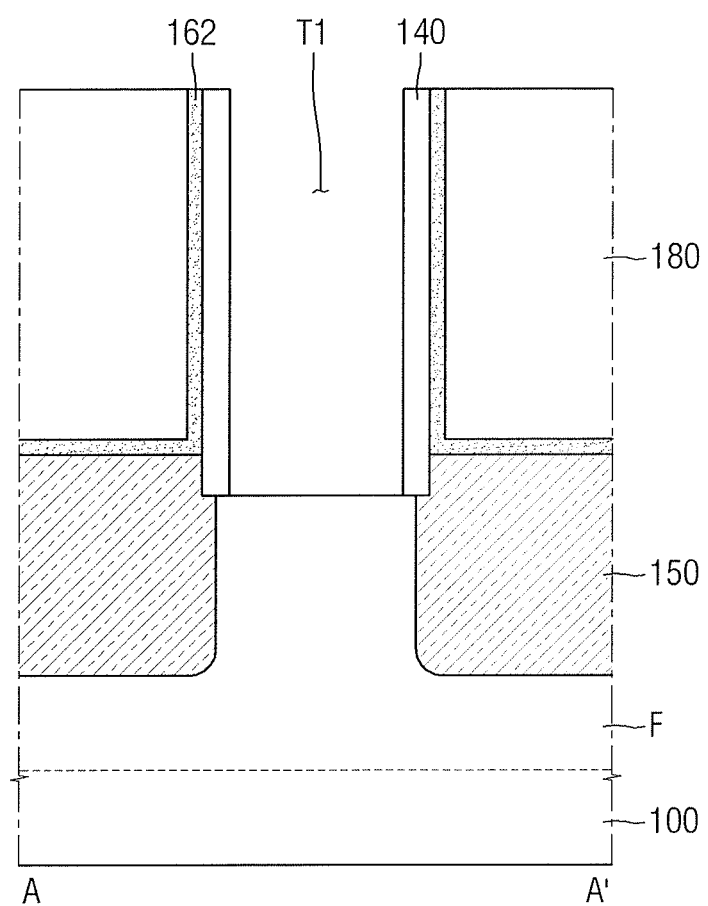

Referring to FIG. 20, the dummy gate dielectric layer 310 and the dummy gate electrode 320 are removed. As a result, the upper surface of the fin type pattern F may be exposed. Also, the first trench T1 defined by the upper surface of the fin type pattern F and the side wall of the first spacer 140 may be formed.

Figure 21:
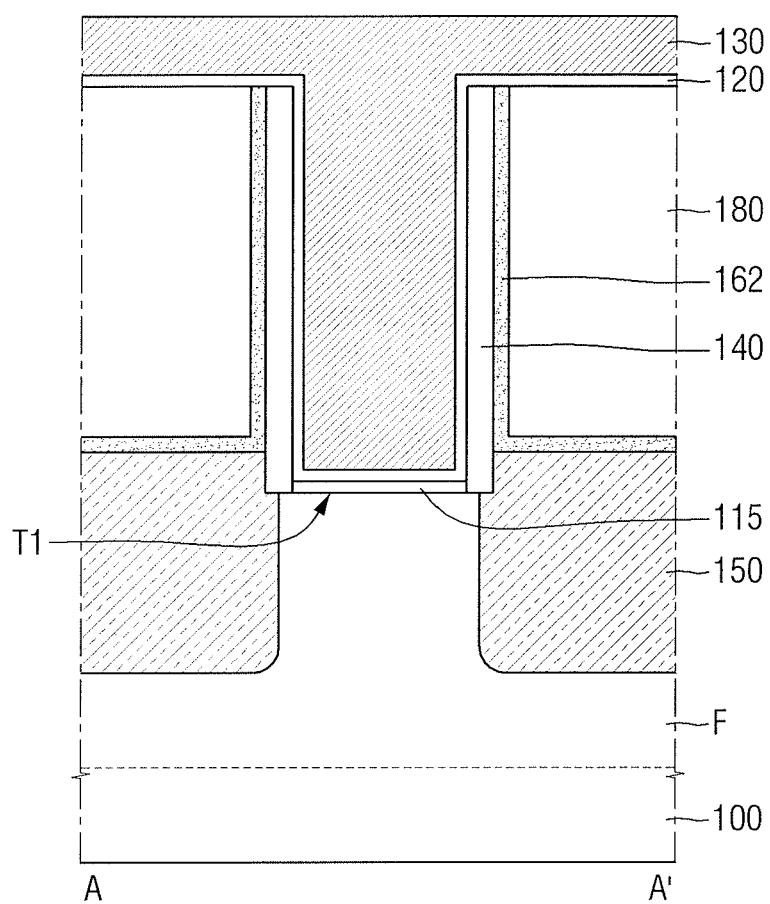

Referring to FIG. 21, the gate dielectric layer 120 and the gate electrode 130 are sequentially formed. The gate dielectric layer 120 and the gate electrode 130 may be formed on the fin type pattern F, the first spacer 140, the first etching stop layer 162, and the first interlayer insulating layer 180. Furthermore, the gate dielectric layer 120 and the gate electrode 130 may be formed to fill the first trench T1.

In some embodiments, formation of the interfacial layer 115 may be further included prior to forming the gate dielectric layer 120 and the gate electrode 130. For example, an oxidation process may be performed on the outer surface of the exposed fin type pattern F. Therefore, the interfacial layer 115 including an oxide may be formed between the substrate 100 and the gate dielectric layer 120.

Figure 22:
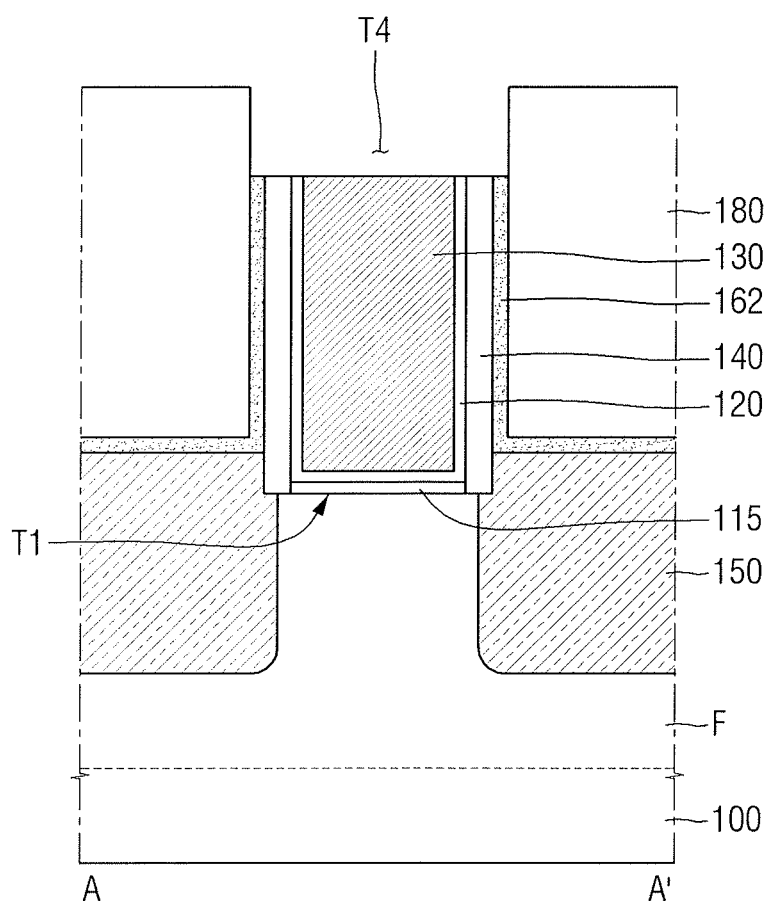

Referring to FIG. 22, a first recess process on the gate electrode 130, the gate dielectric layer 120, the first spacer 140, and the first etching stop layer 162 is performed. For example, the upper part of the gate electrode 130, the upper part of the gate dielectric layer 120, the upper part of the first spacer 140, and the upper part of the first etching stop layer 162 may be recessed until they become lower than the upper surface of the first interlayer insulating layer 180. Accordingly, a fourth trench T4 defined by the upper surface of the gate electrode 130, the upper surface of the gate dielectric layer 120, the upper surface of the first spacer 140, the upper surface of the first etching stop layer 162, and the side wall of the first interlayer insulating layer 180 may be formed.

Figure 23:
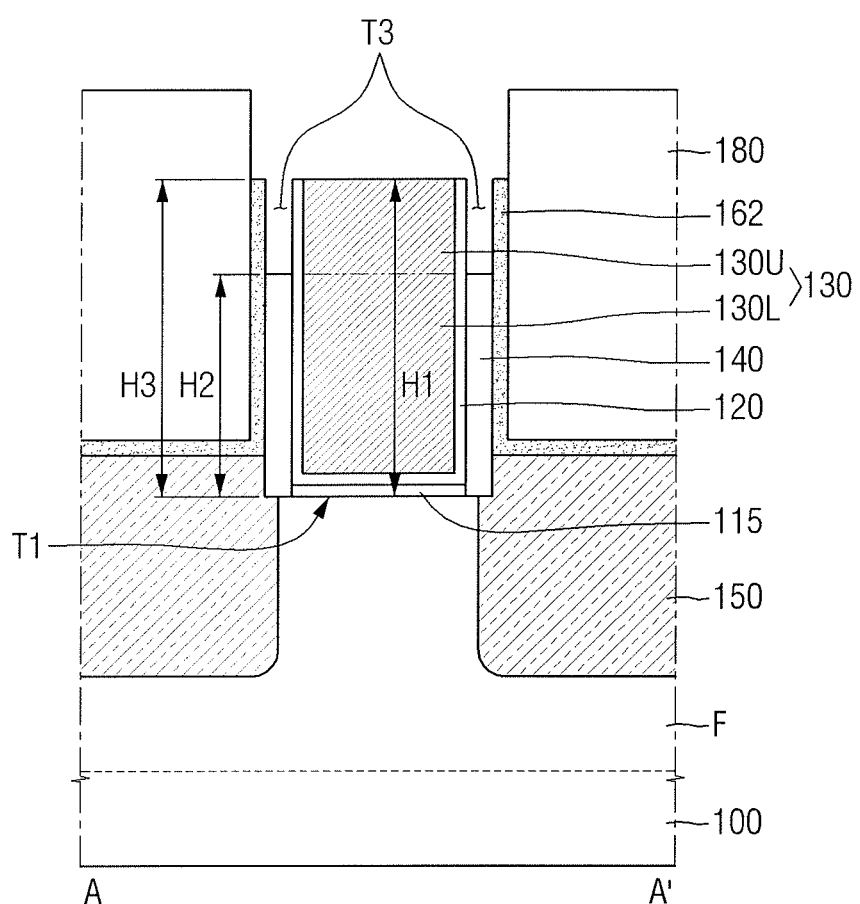

Referring to FIG. 23, a second recess of the first spacer 140 is performed. For example, the upper part of the first spacer 140 may be recessed until it becomes lower than the upper surface of the gate electrode 130. As a result, the second height H2 of the first spacer 140 may be lower than the first height H1 of the gate electrode 130. Accordingly, the third trench T3 defined by the side wall of the first etching stop layer 162, the upper surface of the first spacer 140, and the side wall of the gate dielectric layer 120 may be formed.

Further, the gate electrode 130 may protrude beyond the upper surface of the first spacer 140. At this time, a region of the gate electrode 130 protruding beyond the upper surface of the first spacer 140 may be defined as the upper part 130U, and a region of the gate electrode 130 below the upper part 130U of the gate electrode 130 may be defined as the lower part 130L.

The third height H3 of the first etching stop layer 162 is illustrated as being substantially the same as the first height H1 of the gate electrode 130, but the present disclosure is not limited thereto. For example, the third height H3 of the first etching stop layer 162 may be lower than the first height H1 of the gate electrode 130, depending on the characteristics of the second recess process. Further, the third height H3 of the first etching stop layer 162 may be lower than the second height H2 of the first spacer 140.

Figure 24:
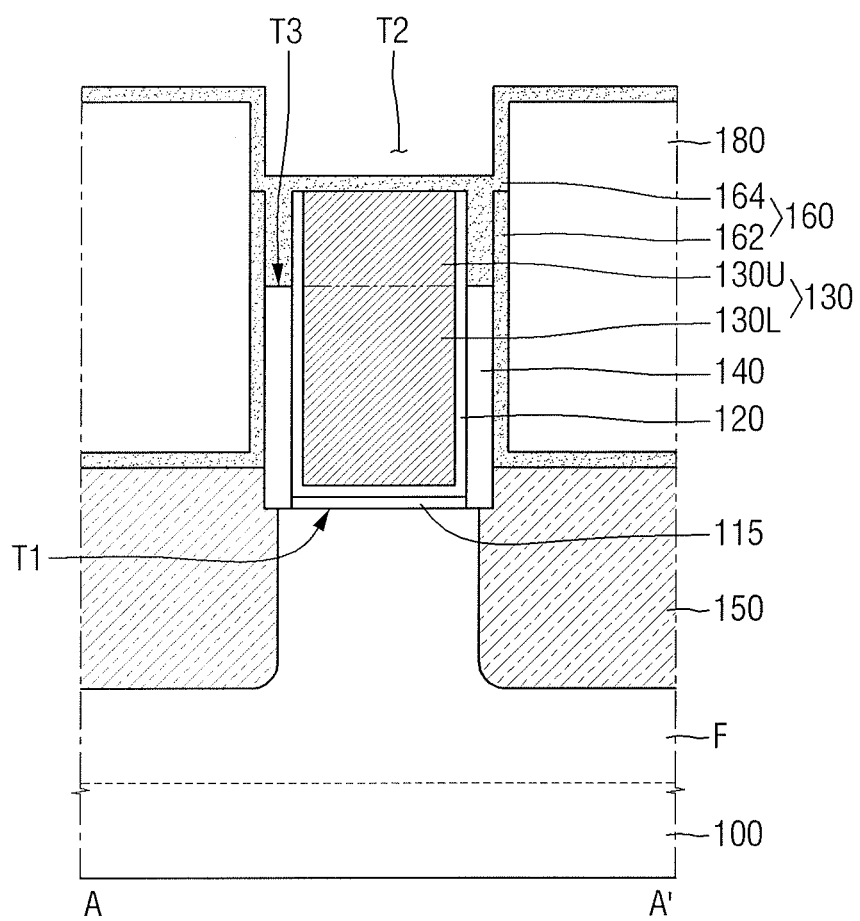

Referring to FIG. 24, the second etching stop layer 164 is formed on the gate electrode 130. For example, the second etching stop layer 164 extending along the profiles of the first interlayer insulating layer 180, the first etching stop layer 162, the first spacer 140, the gate dielectric layer 120, and the gate electrode 130 may be formed. As a result, the second etching stop layer 164 extending along the side wall and the upper surface of the upper part 130U of the gate electrode 130 may be formed. Also, the etching stop layer 160 including the first etching stop layer 162 and the second etching stop layer 164 may be formed.

The second etching stop layer 164 is illustrated as completely filling the third trench T3, but the present disclosure is not limited thereto. In some embodiments, the second etching stop layer 164 may fill only a part of the third trench T3. Alternatively, in some embodiments, the second etching stop layer 164 may also include a void or an air gap in the third trench T3.

In some embodiments, the second trench T2 may be formed in the etching stop layer 160 of the gate electrode 130.

In some embodiments, the first etching stop layer 162 and the second etching stop layer 164 may include substantially the same material. However, the present disclosure is not limited thereto, and the first etching stop layer 162 and the second etching stop layer 164 may include materials different from each other.

Figure 25:
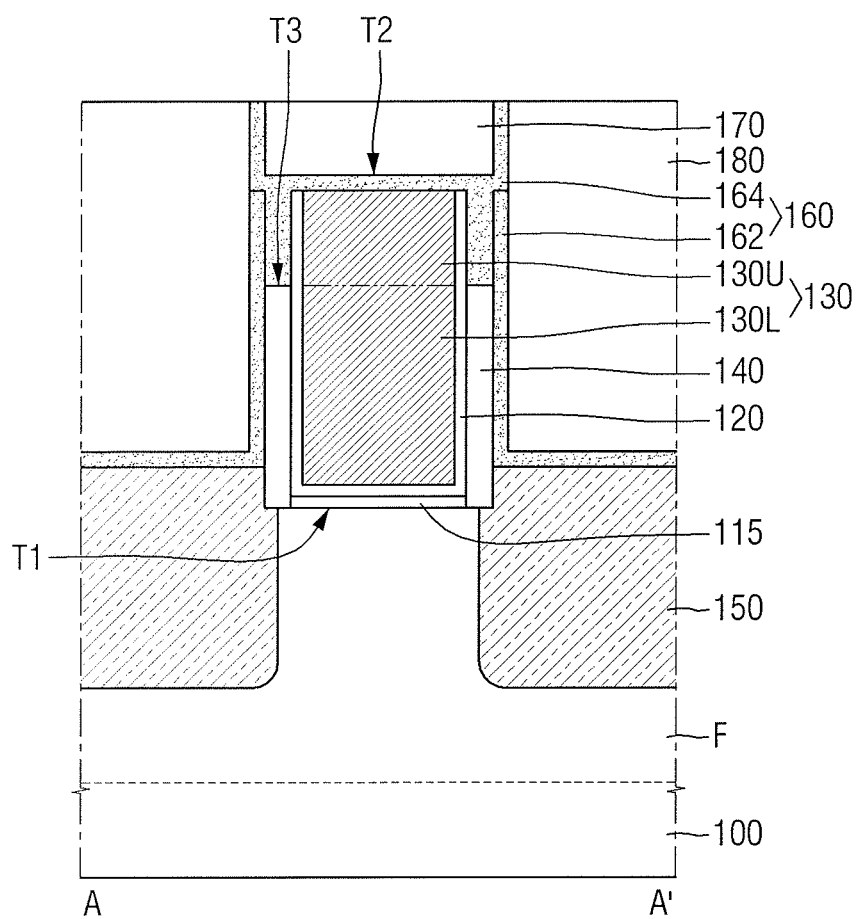

Referring to FIG. 25, the capping pattern 170 is formed in the second trench T2. For example, a capping layer may be formed on the second etching stop layer 164. The capping layer may be formed to fill the second trench T2.

Subsequently, the planarization process may be performed until the upper surface of the first interlayer insulating layer 180 is exposed. The planarization process may include, but is not limited to, e.g., a chemical mechanical polishing (CMP) process. Accordingly, the capping pattern 170 which fills the second trench T2 in the second etching stop layer 164 on the gate electrode 130 may be formed.

Referring to FIG. 26, a contact hole CH which penetrates through the first interlayer insulating layer 180 and the second interlayer insulating layer 280 may be formed. For example, the second interlayer insulating layer 280 may be formed on the first interlayer insulating layer 180, the second etching stop layer 164, and the capping pattern 170.

Subsequently, the contact hole CH which penetrates through the first interlayer insulating layer 180 and the second interlayer insulating layer 280 may be formed on the source/drain region 150. The etching stop layer 160 may function as an etching stop layer in the etching process of forming the contact hole CH. That is, the etching stop layer 160 may protect the upper part 130U of the gate electrode 130 in the process of forming the contact hole CH. Accordingly, it is possible to provide a method for fabricating a semiconductor device capable of fabricating a semiconductor device with improved reliability and process margin.

Subsequently, referring to FIGS. 11 and 12, the contact 190 connected to the source/drain region 150 is formed. For example, the etching stop layer 160 on the source/drain region 150 may be removed. Subsequently, the contact 190 for filling the contact hole CH may be formed. As a result, the contact 190 which is connected to the source/drain region 150 through the first interlayer insulating layer 180, the second interlayer insulating layer 280, and the etching stop layer 160 and may be formed.

Figure 27:
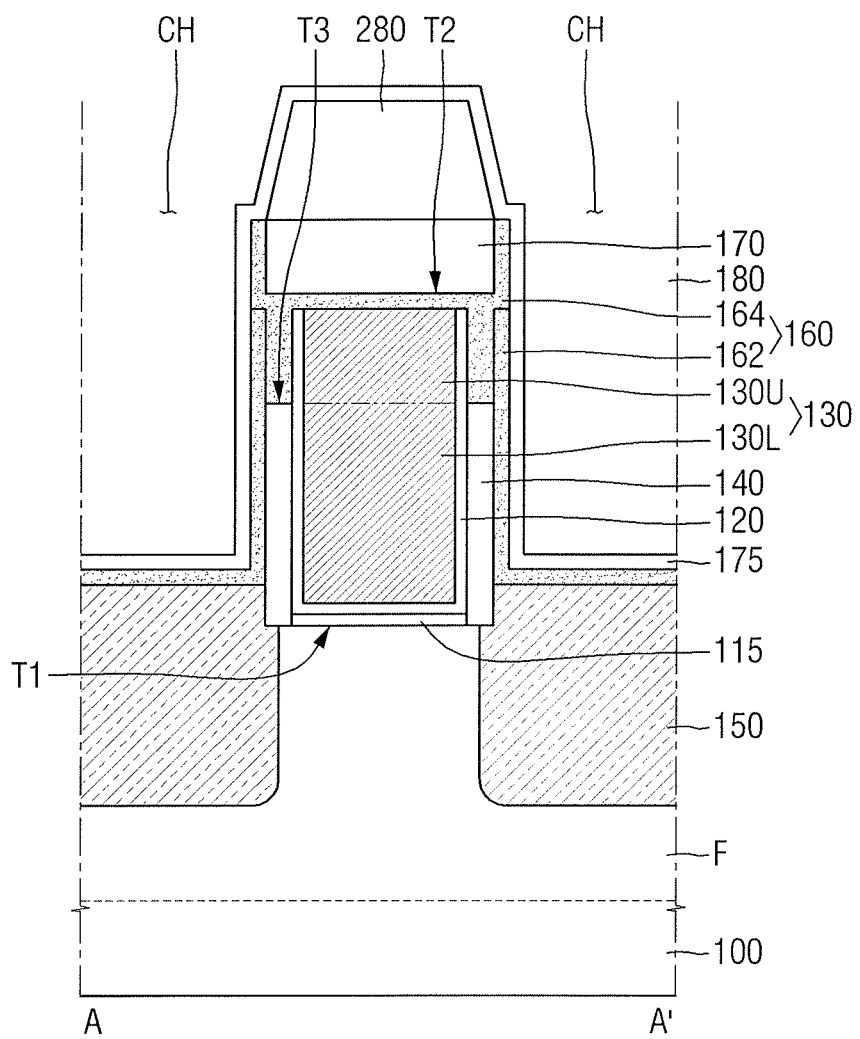
FIG. 27 illustrates an intermediate stage in a method for fabricating a semiconductor device according to some embodiments.

FIG. 27 is an intermediate stage in a method for fabricating a semiconductor device according to some embodiments. For the sake of convenience of explanation, repeated parts of those described with reference to FIGS. 1 to 3, 11 to 13, and 17 to 26 will be only briefly explained or omitted. For reference, FIG. 27 is a diagram for explaining the step subsequent to FIG. 26.

Referring to FIG. 27, the second spacer 175 is formed on the etching stop layer 160. For example, the second spacer 175 extending along the profile of the etching stop layer 160 and the second interlayer insulating layer 280 may be formed.

The second spacer 175 may include, e.g., at least one of silicon oxide, silicon nitride, silicon oxynitride and a low dielectric constant (low-k) material having a dielectric constant lower than silicon oxide.

Subsequently, referring to FIG. 13, the contact 190 connected to the source/drain region 150 is formed. For example, the etching stop layer 160 and the second spacer 175 on the source/drain region 150 may be removed. Subsequently, the contact 190 for filling the contact hole CH may be formed. As a result, the contact 190 connected to the source/drain region 150 through the first interlayer insulating layer 180, the second interlayer insulating layer 280, the etching stop layer 160 and the second spacer 175 may be formed. Accordingly, the method of fabricating the semiconductor device according to some embodiments may provide a semiconductor device in which a parasitic capacitance or a leakage current is reduced.

Figure 28:
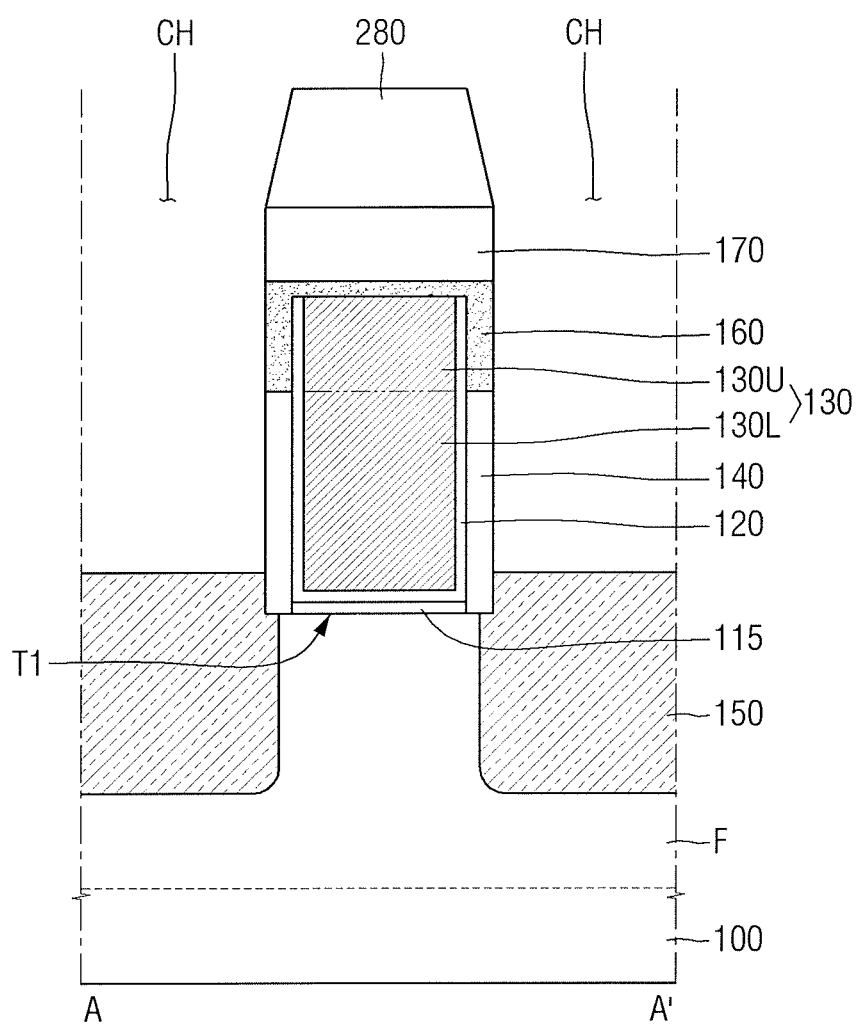
FIG. 28 illustrates an intermediate stage in a method for fabricating a semiconductor device according to some embodiments.

FIG. 28 is an intermediate stage in a method for fabricating a semiconductor device according to some embodiments. For the sake of convenience of explanation, repeated parts of those described with reference to FIGS. 1 to 3, 11, 12, and 17 to 26 will be only briefly explained or omitted. For reference, FIG. 28 is a diagram for explaining the steps subsequent to FIG. 26.

Referring to FIG. 28, a part of the etching stop layer 160 is removed. For example, after forming the contact hole CH, a part of the side wall of the etching stop layer 160 may be removed.

In some embodiments, the etching stop layer 160 may include an aluminum oxide. In such a case, the etching stop layer 160 may be easily removed by, e.g., a wet etching process. Accordingly, in the method of fabricating the semiconductor device according to some embodiments, the thickness of the etching stop layer 160 may be easily adjusted.

Subsequently, referring to FIG. 15, the contact 190 connected to the source/drain region 150 is formed. Accordingly, the contact 190 connected to the source/drain region 150 through the first interlayer insulating layer 180, the second interlayer insulating layer 280 and the etching stop layer 160 may be formed. The space formed by the removed etching stop layer 160 may be filled with the contact 190. Thus, the method of fabricating the semiconductor device according to some embodiments may provide a contact with reduced electrical resistance.

Figure 29:
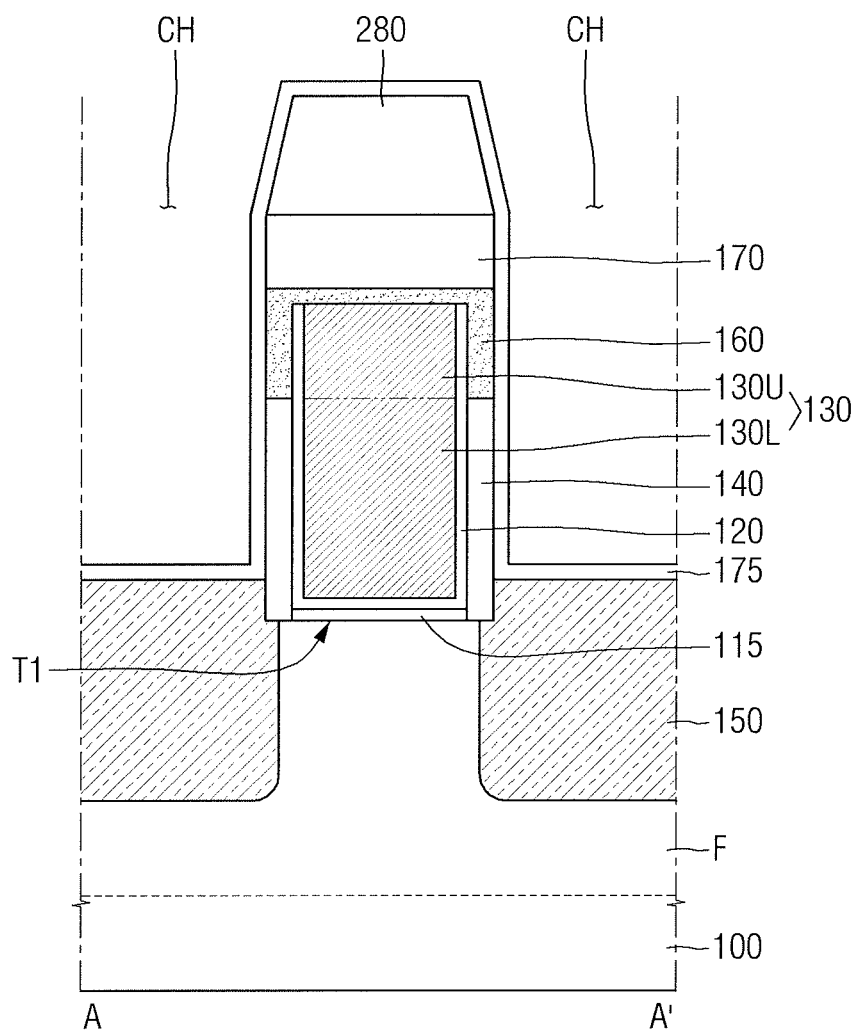
FIG. 29 illustrates an intermediate stage in a method for fabricating s semiconductor device according to some embodiments.

FIG. 29 is an intermediate stage in a method for fabricating the semiconductor device according to some embodiments. For the sake of convenience of explanation, repeated parts of those described with reference to FIGS. 1 to 3, 11, 12, 16 to 26 will be briefly explained or omitted. For reference, FIG. 29 is a diagram for explaining the steps subsequent to FIG. 28.

Referring to FIG. 29, the second spacer 175 is formed on the etching stop layer 160. For example, the second spacer 175 extending along the profile of the first spacer 140, the etching stop layer 160, the capping pattern 170, and the second interlayer insulating layer 280 may be formed. The second spacer 175 may include, e.g., at least one of silicon oxide, silicon nitride, silicon oxynitride and a low dielectric constant (low-k) material having a dielectric constant lower than silicon oxide.

Subsequently, referring to FIG. 16, the contact 190 connected to the source/drain region 150 is formed. For example, the etching stop layer 160 and the second spacer 175 on the source/drain region 150 may be removed. Subsequently, the contact 190 for filling the contact hole CH may be formed. Accordingly, the contact 190 connected to the source/drain region 150 through the first interlayer insulating layer 180, the second interlayer insulating layer 280, the etching stop layer 160 and the second spacer 175 may be formed.

By way of summation and review, a self-aligned contact (SAC) process for forming a contact of a fine pitch with high integration of the semiconductor device may be used. However, a short circuit may occur, e.g., between a gate electrode and a source/drain region, due to the high integration.

In contrast, according to example embodiments, a semiconductor device with improved reliability and process margin may be provided. That is, a semiconductor device according to example embodiments may include an etching stop layer for protecting an upper part of the gate electrode, so short-circuit between the gate electrode and the source/drain may be effectively prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a fin type pattern extending in a first direction on a substrate;
    a field insulating layer on the substrate, the field insulating layer wrapping a side wall of the fin type pattern;
    a gate electrode on the fin type pattern, the gate electrode extending in a second direction intersecting with the first direction;
    a first spacer on a side wall of a lower part of the gate electrode; and
    an etching stop layer covering an uppermost surface of the gate electrode, the etching stop layer extending from the uppermost surface of the gate electrode along a side wall of an upper part of the gate electrode, along a side wall of the first spacer, and along an upper surface of the field insulating layer.

2. The semiconductor device as claimed in claim 1, wherein the etching stop layer includes:
    a first etching stop layer on the side wall of the first spacer, the first etching stop layer protruding above an upper surface of the first spacer; and
    a second etching stop layer extending continuously from an edge of the first etching stop layer along the side wall of the upper part of the gate electrode to cover the uppermost surface of the gate electrode.

3. The semiconductor device as claimed in claim 2, wherein the second etching stop layer fills a first trench defined by a side wall of the first etching stop layer, the upper surface of the first spacer, and the side wall of the upper part of the gate electrode.

4. The semiconductor device as claimed in claim 1, further comprising a capping pattern on the etching stop layer, the capping pattern having a dielectric constant lower than that of the etching stop layer.

5. The semiconductor device as claimed in claim 4, wherein the etching stop layer includes a second trench above the gate electrode, the capping pattern filling the second trench.

6. The semiconductor device as claimed in claim 4, wherein the capping pattern includes silicon nitride.

7. The semiconductor device as claimed in claim 1, wherein a first thickness of the etching stop layer on the side wall of the first spacer is smaller than a second thickness of the etching stop layer on the side wall of the upper part of the gate electrode.

8. The semiconductor device as claimed in claim 4, wherein:
    the etching stop layer extends between the uppermost surface of the gate electrode and a bottom surface of the capping pattern, the etching stop layer covering at least two side walls of the capping pattern,
    a first thickness of the etching stop layer on the side wall of the first spacer is different from a second thickness of the etching stop layer on a side wall of the upper part of the gate electrode, and
    a third thickness of the etching stop layer on a side wall of the at least two sidewalls of the capping pattern is different from the second thickness.

9. The semiconductor device as claimed in claim 1, wherein the etching stop layer includes at least one of aluminum oxide, aluminum nitride, silicon carbide, and combinations thereof.

10. The semiconductor device as claimed in claim 1, further comprising a second spacer on the side wall of the etching stop layer, the second spacer having a dielectric constant lower than that of the etching stop layer.

11. A semiconductor device, comprising:
    a substrate;
    a gate electrode on the substrate; the gate electrode including a lower part and an upper part;
    a spacer on a side wall of the lower part of the gate electrode;
    an etching stop layer on the spacer, the etching stop layer extending along a side wall of the upper part of the gate electrode and along an uppermost surface of the gate electrode; and
    a capping pattern on the etching stop layer, the etching stop layer being between the capping pattern and the uppermost surface of the gate electrode, and the capping pattern having a dielectric constant lower than that of the etching stop layer.

12. The semiconductor device as claimed in claim 11, wherein the etching stop layer includes aluminum oxide.

13. The semiconductor device as claimed in claim 11, wherein the etching stop layer includes a trench in the etching stop layer above the gate electrode, the capping pattern filling the trench.

14. The semiconductor device as claimed in claim 11, wherein the etching stop layer further extends along a side wall of the spacer.

15. The semiconductor device as claimed in claim 11, wherein the etching stop layer does not extend along a side wall of the spacer.

16. The semiconductor device as claimed in claim 11, further comprising a source/drain region in the substrate on a side wall of the gate electrode, the etching stop layer further extending along an outer surface of the source/drain region.

17. The semiconductor device as claimed in claim 16, further comprising a contact on the source/drain region, the contact being connected to the source/drain region through the etching stop layer.

18. A semiconductor device, comprising:
a substrate;
a gate electrode on the substrate;
a spacer on a side wall of the gate electrode; and
an etching stop layer on side walls of the gate electrode and the spacer, and covering an uppermost surface of the gate electrode, the etching stop layer including aluminum oxide,
wherein a height of an upper surface of the spacer is lower than a height of an upper surface of the gate electrode.

19. The semiconductor device as claimed in claim 18, wherein the etching stop layer extends along a side wall and an upper surface of an upper part of the gate electrode.

20. The semiconductor device as claimed in claim 18, wherein the etching stop layer includes:
a first etching stop layer on a side wall of the spacer, the first etching stop layer protruding above upper surface of the spacer; and
a second etching stop layer extending along the side wall and the upper surface of the gate electrode.

* * * * *